US006809976B2

(12) United States Patent
Ooishi

(10) Patent No.: US 6,809,976 B2
(45) Date of Patent: Oct. 26, 2004

(54) NON-VOLATILE SEMICONDUCTOR MEMORY DEVICE CONDUCTING READ OPERATION USING A REFERENCE CELL

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/351,304

(22) Filed: Jan. 27, 2003

(65) Prior Publication Data

US 2004/0017718 A1 Jan. 29, 2004

(30) Foreign Application Priority Data

Jul. 25, 2002 (JP) .................................... 2002-216103

(51) Int. Cl.[7] .............................................. G11C 7/02
(52) U.S. Cl. .................. 365/210; 365/158; 365/189.07
(58) Field of Search ............................... 365/210, 158, 365/148, 171, 173, 189.07, 200, 201, 185.21, 185.22, 185.23, 100

(56) References Cited

U.S. PATENT DOCUMENTS

| 5,815,449 A | * | 9/1998 | Taura ........................ 365/200 |
| 6,222,762 B1 | * | 4/2001 | Guterman et al. ..... 365/185.03 |
| 6,347,056 B1 | | 2/2002 | Ledford et al. |
| 6,646,911 B2 | * | 11/2003 | Hidaka ....................... 365/173 |

FOREIGN PATENT DOCUMENTS

JP          05-136361        6/1993

OTHER PUBLICATIONS

Roy–Scheuerlein et al.; A 10ns Read and Write Non–Colatile Memory Array a Magnetic Tunnel Junction and FET Switch in Each Cell; ISSCC Digest of Technical Papers; TA 7.2; Feb. 2000; pp. 94–95, 128–129, 409–410.
M. Durlam et al.; Nonvolatile RAM based on Magnetic Tunnel Junction Elements; ISSCC Digest of Technical Papers, TA 7.3; Feb. 2000; pp. 96–97, 130–131, 410–411.
Peter K. Naji et al.; A 256kb 3.DV 1T1MTJ Nonvolatile Magnetoresistive RAM; ISSCC Digest of Technical Papers; TA 7.6; Feb. 2001; pp. 94–95, 122–123, 404–405, 438.

* cited by examiner

*Primary Examiner*—Gene N. Auduong
(74) *Attorney, Agent, or Firm*—Burns, Doane, Swecker & Mathis, L.L.P.

(57) ABSTRACT

A spare reference cell is provided for a reference cell which is compared to a selected memory cell in read operation. A data read circuit reads storage data of a selected memory cell based on access to the selected memory cell and access to a selected one of the reference cell and the spare reference cell. Selection of the reference cell and the spare reference cell is not fixed according to the result of operation test conducted before a device is used, but can be switched according to various conditions.

15 Claims, 17 Drawing Sheets

NON-VOLATILE SEMICONDUCTOR MEMORY DEVICE CONDUCTING READ OPERATION USING A REFERENCE CELL

BACKGROUND OF THE INVENTION

1. Field of the Invention

The present invention generally relates to a non-volatile semiconductor memory device. More particularly, the present invention relates to a non-volatile semiconductor memory device including a reference cell which is compared with a selected memory cell in read operation.

2. Description of the Background Art

An MRAM (Magnetic Random Access Memory) device has attracted attention as a memory device capable of non-volatile data storage with low power consumption. The MRAM device is a non-volatile memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256kb 3.0V 1T1MTJ Nonvolatile Magnetoresistive RAM", ISSCC Digest of Technical Papers, TA7.6, February 2001.

FIG. 18 schematically shows the structure of a memory cell having a magnetic tunnel junction (hereinafter, sometimes simply referred to as "MTJ memory cell").

Referring to FIG. 18, the MTJ memory cell includes a tunneling magneto-resistance element TMR and an access transistor ATR. Tunneling magneto-resistance element TMR has an electric resistance varying according to a magnetically written storage data level. Access transistor ATR is connected in series with tunneling magneto-resistance element TMR between a bit line BL and a source voltage line SL. Typically, a field effect transistor formed on a semiconductor substrate is used as access transistor ATR.

A bit line BL, a write digit line WDL, a word line WL and a source voltage line SL are provided for the MTJ memory cell. Bit line BL and write digit line WDL allow data write currents of different directions to flow therethrough in write operation, respectively. Word line WL is used to conduct read operation. Source voltage line SL pulls down tunneling magneto-resistance element TMR to a ground voltage GND in read operation. In read operation, tunneling magneto-resistance element TMR is electrically coupled between source voltage line SL and bit line BL in response to turning-ON of access transistor ATR.

FIG. 19 is a conceptual diagram illustrating write operation to the MTJ memory cell.

Referring to FIG. 19, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction corresponding to an external magnetic field (hereinafter, sometimes simply referred to as "free magnetic layer"). A tunneling barrier (tunneling film) TB is interposed between fixed magnetic layer FL and free magnetic layer VL. Tunneling barrier TB is formed from an insulator film. Free magnetic layer VL is magnetized either in the same direction as or in the opposite direction to that of fixed magnetic layer FL according to a write data level. Fixed magnetic layer FL, tunneling barrier TB and free magnetic layer VL form a magnetic tunnel junction.

The electric resistance of tunneling magneto-resistance element TMR varies according to the relation between the respective magnetization directions of fixed magnetic layer FL and free magnetic layer VL. More specifically, the electric resistance of tunneling magneto-resistance element TMR has a minimum value Rmin when fixed magnetic layer FL and free magnetic layer VL have the same (parallel) magnetization direction, and has a maximum value Rmax when they have opposite (antiparallel) magnetization directions.

In write operation, word line WL is inactivated and access transistor ATR is turned OFF. In this state, a data write current for magnetizing free magnetic layer VL is applied to each of bit line BL and write digit line WDL in a direction corresponding to the write data level.

FIG. 20 is a conceptual diagram showing the relation between the data write current and the magnetization direction of the tunneling magneto-resistance element in write operation.

Referring to FIG. 20, the abscissa H(EA) indicates a magnetic field which is applied to free magnetic layer VL of tunneling magneto-resistance element TMR in the easy-axis (EA) direction. The ordinate H(HA) indicates a magnetic field which is applied to free magnetic layer VL in the hard-axis (HA) direction. Magnetic fields H(EA), H(HA) respectively correspond to two magnetic fields produced by the currents flowing through bit line BL and write digit line WDL.

In the MTJ memory cell, fixed magnetic layer FL is magnetized in the fixed direction along the easy axis of free magnetic layer VL. Free magnetic layer VL is magnetized either in the direction parallel or antiparallel (opposite) to that of fixed magnetic layer FL along the easy axis according to the storage data level ("1" and "0"). The MTJ memory cell is thus capable of storing 1-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line in FIG. 20. In other words, the magnetization direction. of free magnetic layer VL does not change if the strength of an applied data write magnetic field corresponds to the region inside the asteroid characteristic line.

As shown by the asteroid characteristic line, applying a magnetic field of the hard-axis direction to free magnetic layer VL enables reduction in a magnetization threshold value required to change the magnetization direction along the easy axis.

When the operation point of write operation is designed as in the example of FIG. 20, a data write magnetic field of the easy-axis direction is designed to have a strength $H_{WR}$ in the MTJ memory cell to be written. In other words, a data write current to be applied to bit line BL or write digit line WDL is designed to produce the data write magnetic field $H_{WR}$. In general, data write magnetic field $H_{WR}$ is given by the sum of a switching magnetic field $H_{SW}$ required to switch the magnetization direction and a margin $\Delta H$. Data write magnetic field $H_{WR}$ is thus given by $H_{WR}=H_{SW}+\Delta H$.

In order to rewrite the storage data of the MTJ memory cell, that is, the magnetization direction of tunneling magneto-resistance element TMR, a data write current of a prescribed level or more must be applied to both write digit line WDL and bit line BL. Free magnetic layer VL in tunneling magneto-resistance element TMR is thus magnetized in the direction parallel or opposite (antiparallel) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted FIG. 21 is a conceptual diagram illustrating read operation from the MTJ memory cell.

Referring to FIG. 21, in read operation, access transistor ATR is turned ON in response to activation of word line WL. As a result, tunneling magneto-resistance element TMR is pulled down to ground voltage GND and electrically coupled to bit line BL.

If bit line BL is then pulled up to a prescribed voltage, a memory cell current Icell corresponding to the electric resistance of tunneling magneto-resistance element TMR, that is, the storage data level of the MTJ memory cell, flows through a current path including bit line BL and tunneling magneto-resistance element TMR. For example, the storage data can be read from the MTJ memory cell by comparing memory cell current Icell with a prescribed reference current.

The electric resistance of tunneling magneto-resistance element TMR thus varies according to the magnetization direction that is rewritable by an applied data write magnetic field. Accordingly, non-volatile data storage can be realized by using electric resistances Rmax, Rmin of tunneling magneto-resistance element TMR as the storage data levels ("1"and "0").

Data storage of the MRAM device is thus realized by using the difference between connection resistances, $\Delta$Rcell ($\Delta$Rcell=Rmax−Rmin), which corresponds to the difference between storage data levels in tunneling magneto-resistance element TMR.

In general, the MRAM device includes reference cells in addition to normal MTJ memory cells for storing data. In read operation, a reference cell is compared with a memory cell selected for read operation (hereinafter, sometimes referred to as "selected memory cell"). In such an MRAM device, the storage data level of the selected memory cell is determined by comparing the access result to the selected memory cell with the access result to the reference cell.

For example, a reference cell is designed so that a current passing therethrough has an intermediate value of two memory cell currents Icell corresponding to the two electric resistances Rmax, Rmin of the MTJ memory cell. In this case, a reference cell must be fabricated to have an electric resistance having an intermediate level of electric resistances Rmax, Rmin. However, implementation of such an electric resistance requires special design and fabrication for a reference cell. This complicates the reference cell structure, thereby possibly causing an increased chip area and a reduced processing margin of a memory cell array.

In a common MTJ memory cell, the resistance difference $\Delta$Rcell generated according to the storage data level is not so large. Typically, electric resistance Rmin is at most about several tens of percents of electric resistance Rmax. Memory cell current Icell therefore varies at most on the order of microamperes ($\mu$A: $10^{-6}$A) according to the storage data level. A reference cell is therefore required to generate a reference current with high accuracy. Accordingly, it must be ensured that erroneous reading occurs if characteristics of a reference cell are varied in a manufacturing process.

Moreover, a reference cell is commonly provided for every plurality of MTJ memory cells. Therefore, the reference cell is accessed more frequently than each MTJ memory cell. Such frequent access to the reference cell degrades the characteristics of the reference cell with time, thereby possibly reducing read operation accuracy.

Such a problem occurs not only in an MRAM device but also in a non-volatile semiconductor memory device which conducts read operation based on the access result to a selected memory cell and a reference cell. Therefore, read operation accuracy of such a non-volatile semiconductor memory device must be prevented from being reduced even if the characteristics of a reference cell are varied in a manufacturing process or degraded with time.

SUMMARY OF THE INVENTION

It is an object of the present invention to provide a non-volatile semiconductor memory device capable of stably conducting read operation even if characteristics of a reference cell are varied in a manufacturing process or degraded with time.

According to one aspect of the present invention, a non-volatile semiconductor memory device includes a plurality of memory cells, a reference cell, a spare reference cell, a reference cell selecting section, and a data read circuit. Each of the plurality of memory cells stores data in a non-volatile manner. The reference cell is compared with a selected one of the plurality of memory cells in read operation. The spare reference cell has same characteristics as those of the reference cell, and is provided as a spare of the reference cell. The reference cell selecting section selects one of the reference cell and the spare reference cell in the read operation. The data read circuit reads storage data of the selected memory cell based on access to the one of the reference cell and the spare reference cell which is selected by the reference cell selecting section and access to the selected memory cell. The reference cell selecting section is capable of switching selection of the reference cell and the spare reference cell according to conditions.

Accordingly, a main advantage of the present invention is that selection of the reference cell and the spare reference cell is not fixed before the non-volatile semiconductor memory device is used, but can be dynamically switched according to various conditions after the non-volatile semiconductor memory device is used. Therefore, read operation accuracy can be retained even if characteristics of the reference cell are varied in the manufacturing process or degraded with time. As a result, operation reliability can be improved.

According to another aspect of the present invention, a non-volatile semiconductor memory device includes a plurality of memory cells, a plurality of reference cells, and a data read circuit. Each of the plurality of memory cells stores data in a non-volatile manner. The plurality of reference cells are compared with a selected one of the plurality of memory cells in read operation. The data read circuit reads storage data of the selected memory cell based on access to the selected memory cell and access to at least two of the plurality of reference cells in the read operation.

The above non-volatile semiconductor memory device conducts read operation from the selected memory cell based on access to a plurality of reference cells. Therefore, even if at least-one of the plurality of accessed reference cells have unsatisfactory characteristics, the influence of such unsatisfactory characteristics is reduced, whereby possibility of erroneous reading can be suppressed. As a result, operation reliability can be improved in terms of manufacturing variation of reference cell characteristics and degradation in reference cell characteristics with time.

According to still another aspect of the present invention, a non-volatile semiconductor memory device includes a plurality of memory cells, a reference cell, a data read circuit, and a reference cell test section. Each of the plurality of memory cells stores data in a non-volatile manner. The reference cell is compared with a selected one of the plurality of memory cells in read operation. The data read circuit reads storage data of the selected memory cell based on access to the reference cell and access to the selected memory cell in the read operation in normal operation. The reference cell test section tests the reference cell in operation test other than the normal operation.

Since the reference cell is more frequently accessed than the memory cells, the reference cell is more likely to be degraded with time. The above non-volatile semiconductor memory device is capable of conducting operation test for detecting a defective reference cell even after the non-volatile semiconductor memory device is used.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
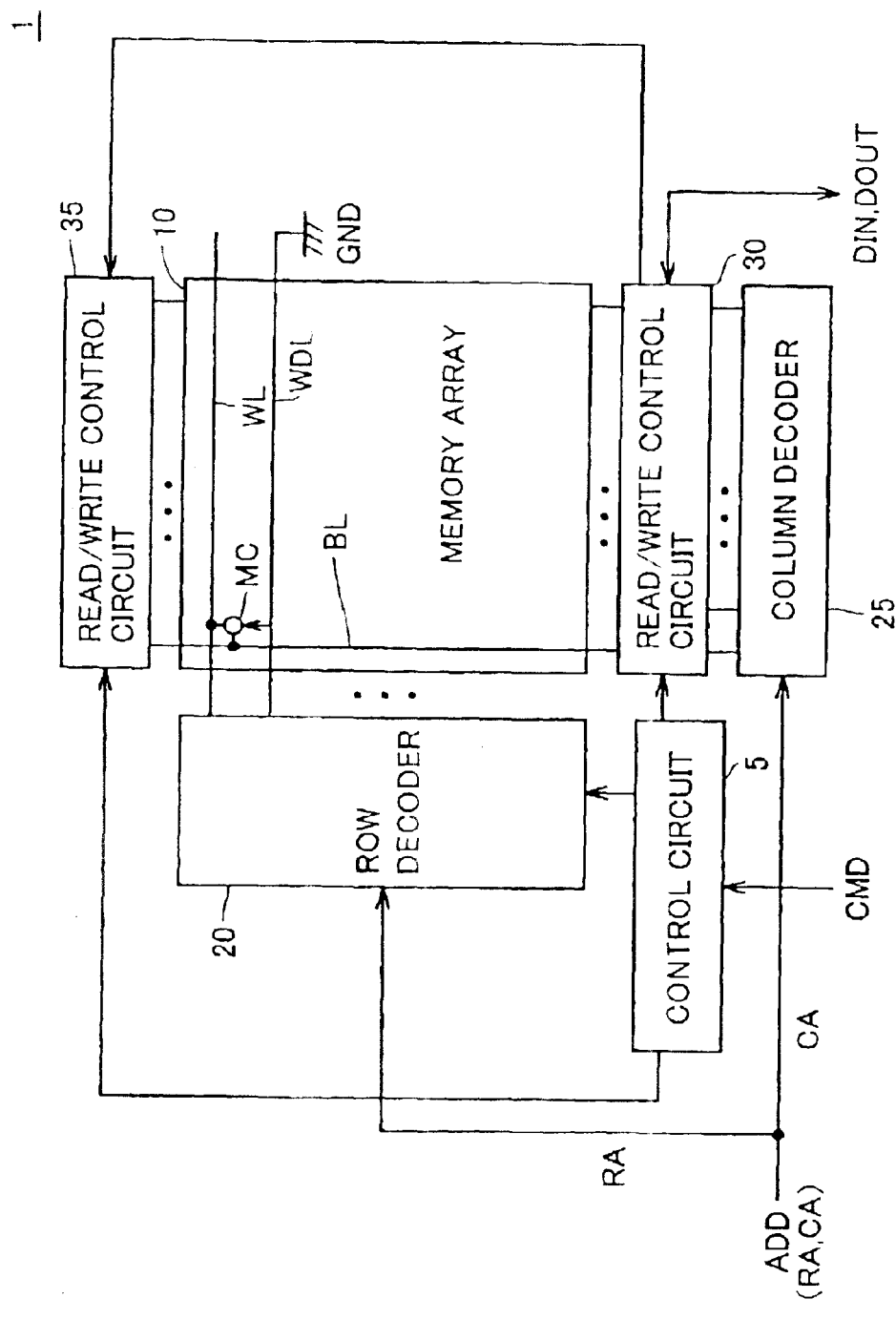
FIG. 1 is a schematic block diagram showing the overall structure of an MRAM device according to an embodiment of the present invention.

Hereinafter, embodiments of the present invention will be described in detail with reference to the accompanying drawings. Note that the same reference numerals and characters denote the same or corresponding portions throughout the figures.

First Embodiment

An MRAM device 1 of FIG. 1 is shown as a typical example of a non-volatile semiconductor memory device according to the present invention. It is appreciated from the following description that the present invention is not limited to MRAM devices but is commonly applicable to non-volatile semiconductor memory devices which conduct read operation based on the comparison between access to a selected memory cell and access to a reference cell.

Referring to FIG. 1, MRAM device 1 according to an embodiment of the present invention conducts random access in response to an external control signal CMD and an external address signal ADD in order to write input data DIN to, or read output data DOUT from, a selected memory cell corresponding to the address signal.

MRAM device 1 includes a control circuit 5 for controlling the overall operation of MRAM device 1 in response to control signal CMD, and a memory array 10 having MTJ memory cells MC arranged in a matrix.

In memory array 10, word lines WL and write digit lines WDL are provided corresponding to the MTJ memory cell rows, and bit lines BL are provided corresponding to the MTJ memory cell columns. FIG. 1 exemplarily shows a single MTJ memory cell MC, and a corresponding word line WL, write digit line WDL and bit line BL.

MRAM device 1 further includes a row decoder 20, a column decoder 25 and read/write control circuits 30, 35. Row decoder 20 selects a row in memory array 10 according to a row address RA indicated by address signal ADD. Column decoder 25 selects a column in memory array 10 according to a column address CA indicated by address signal ADD.

Read/write control circuits 30, 35 each collectively refers to a circuit group for conducting read and write operations from and to an MTJ memory cell MC in memory array 10.

Hereinafter, binary voltage states of a signal, a signal line, data and the like (i.e., a high-voltage state (e.g., power supply voltage Vcc1, Vcc2) and a low-voltage state (e.g., ground voltage GND)) are sometimes referred to as "H level" and "L level", respectively.

Figure 2:
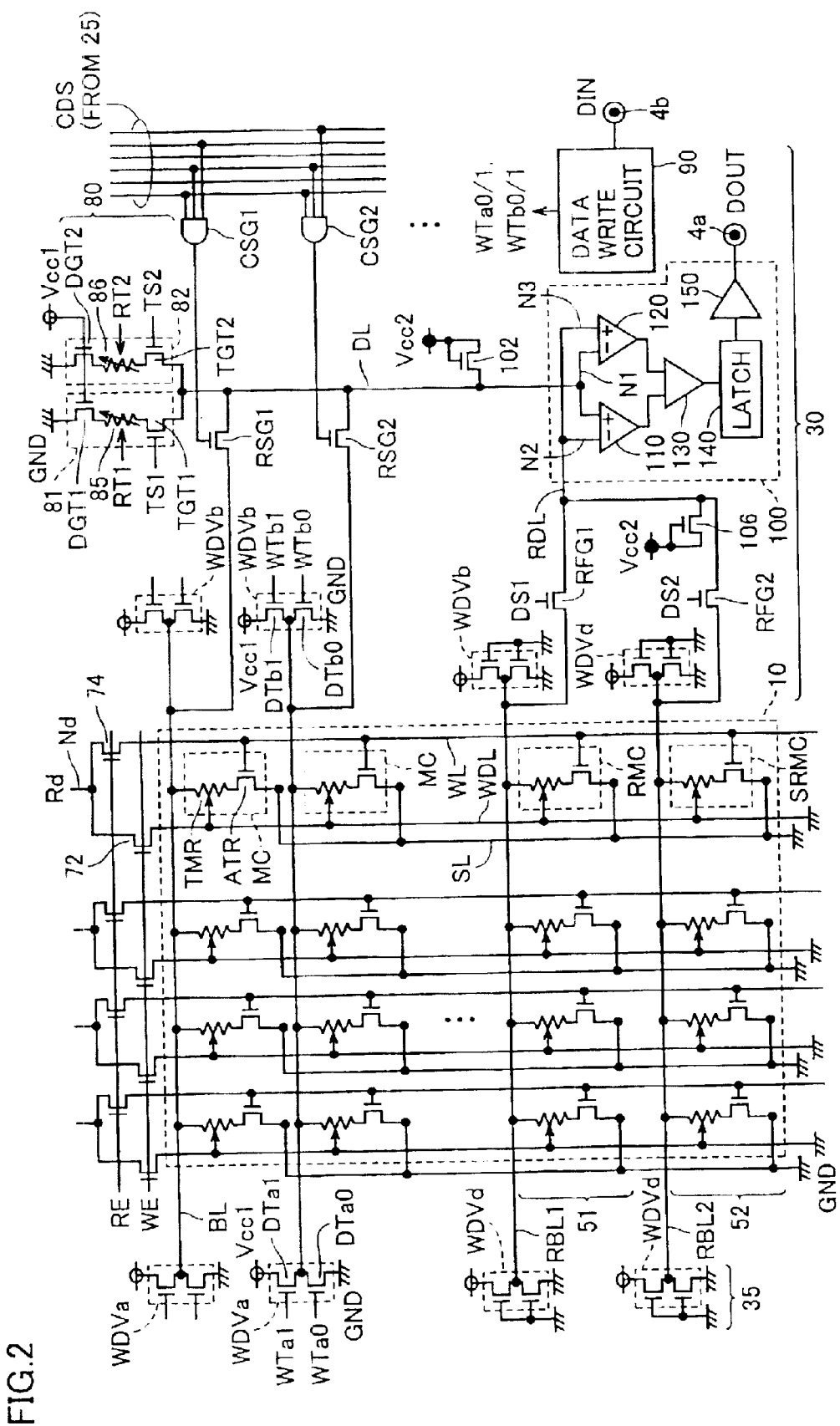
FIG. 2 is a circuit diagram showing the structure of a memory array and a peripheral circuit group for conducting read and write operations according to a first embodiment of the present invention.

FIG. 2 is a circuit diagram showing the structure of memory array 10 and the circuit group for conducting read and write operations according to the first embodiment.

Referring to FIG. 2, memory array 10 has MTJ memory cells MC arranged in a matrix. As described before, word lines WL and write digit lines WDL are provided corresponding to the memory cell rows, and bit lines BL are provided corresponding to the memory cell columns. Source lines SL are also provided corresponding to the memory cell rows.

Figure 18:
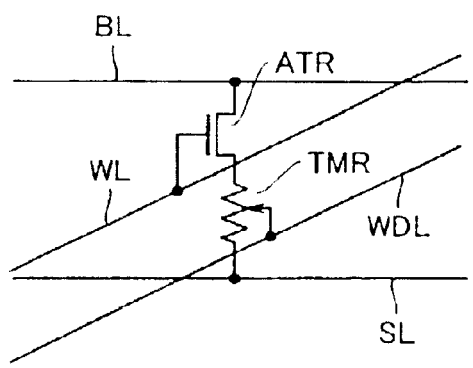
FIG. 18 schematically shows the structure of an MTJ memory cell.

Each MTJ memory cell MC has the same structure as that described in FIG. 18, and includes a tunneling magneto-resistance element TMR and an access transistor ATR which are connected in series between a corresponding bit line BL and a corresponding source line SL.

As described before, tunneling magneto-resistance element TMR has an electric resistance corresponding to the magnetization direction. In other words, in each MTJ memory cell MC, tunneling magneto-resistance element TMR is magnetized in a prescribed direction in order to store either H-level ("1") or L-level ("0") data. Tunneling magneto-resistance element TMR thus has either an electric resistance Rmax or Rmin according to the storage data level.

Each source line SL is coupled to ground voltage GND. As a result, the source voltage of each access transistor ATR is fixed to ground voltage GND. In a selected row corresponding to a word line WL activated to H level, each tunneling magneto-resistance element TMR is pulled down to ground voltage GND and connected to a corresponding bit line BL.

Memory array 10 further includes a plurality of reference cells RMC arranged in a reference cell column 51, and a plurality of spare reference cells SRMC arranged in a spare reference cell column 52. Reference cell RMC is provided as a cell to be compared with a selected memory cell in read operation. Spare reference cell SRMC is provided as a spare of reference cell RMC. Hereinafter, MTJ memory cells MC each functioning as a valid bit are sometimes referred to as "normal memory cells MC" in order to distinguish MTJ memory cells MC from reference cells RMC and spare reference cells SRMC.

Reference cell RMC and spare reference cell SRMC have the same structure and characteristics as those of MTJ memory cell MC. Accordingly, MTJ memory cells corresponding to two columns are provided in addition to the MTJ memory cells used as normal memory cells MC. These additional MTJ memory cells are used as reference cells RMC (reference cell column 51) and spare reference cells SRMC (spare reference cell column 52).

The use of reference cells RMC and spare reference cells SRMC having the same structure and shape as those of normal memory cells MC eliminates the need for special design and a special manufacturing process for the reference cells. Since the manufacturing process is not complicated, the reference cells can be manufactured without causing increase in chip area, reduction in processing margin of the memory array, and the like. Especially, the use of such reference cells RMC and spare reference cells SRMC ensures continuity of the structure in memory array 10. This contributes to stabilization of characteristics of normal memory cells MC, reference cells RMC and spare reference cells SRMC in the manufacturing process.

Reference cells RMC and spare reference cells SRMC are required to fixedly hold storage data of a prescribed level. In other words, reference cells RMC and spare memory cells SRMC are magnetized in a direction corresponding to the prescribed level in the manufacturing process, and data need not be written to reference cells RMC and spare memory cells SRMC in normal operation.

Figure 19:
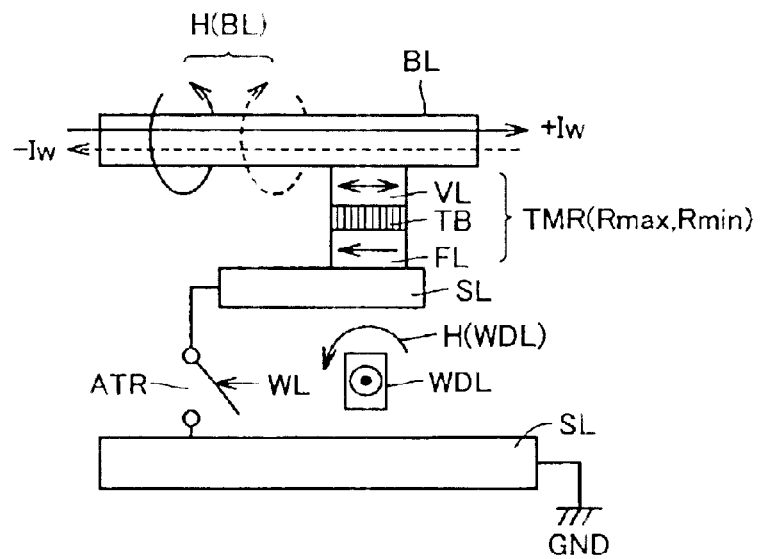
FIG. 19 is a conceptual diagram illustrating write operation to an MTJ memory cell.
Figure 20:
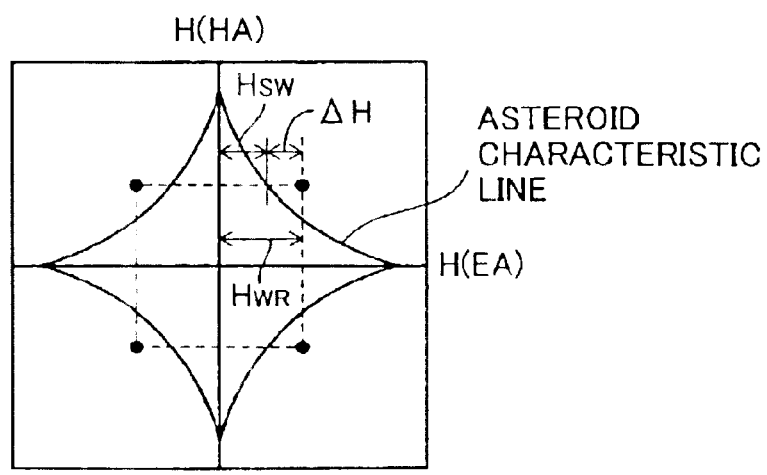
FIG. 20 is a conceptual diagram showing the relation between a data write current and a magnetization direction of a tunneling magneto-resistance element in write operation.
Figure 21:
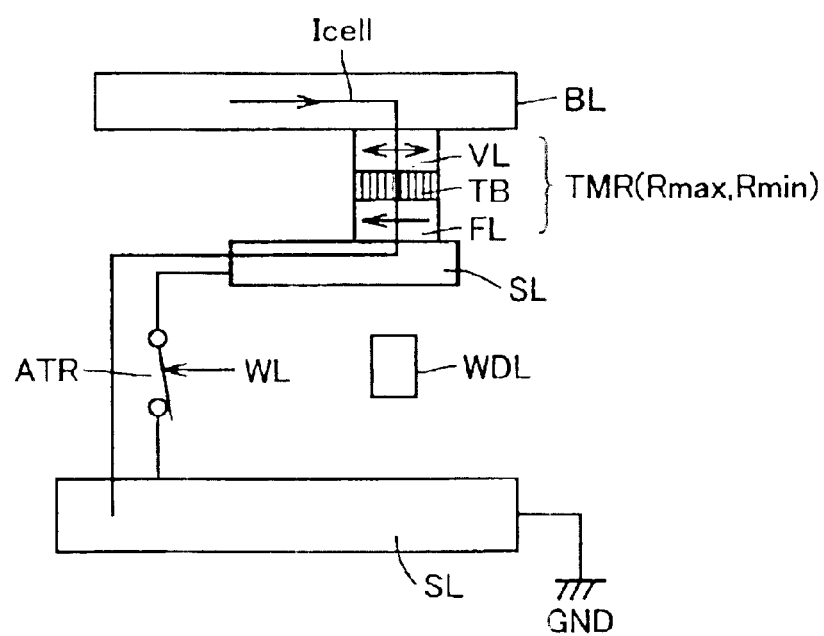
FIG. 21 is a conceptual diagram illustrating read operation from an MTJ memory cell.

Especially when the prescribed level corresponds to electric resistance Rmin in the MTJ memory cell, fixed magnetic layer FL and free magnetic layer VL (see FIG. 19 and the like) in reference cells RMC and spare reference cells SRMC need only be magnetized in the same direction in the manufacturing process. This enables the magnetization process in the manufacturing process to be conducted efficiently. Accordingly, it is herein assumed that reference cells RMC and spare reference cells SRMC store the level corresponding to electric resistance Rmin.

Reference cells RMC and spare reference cells SRMC share the memory cell rows with normal memory cells MC. A reference bit line RBL1 is provided corresponding to reference cell column 51, and a reference bit line RBL2 is provided corresponding to spare reference cell column 52.

Accordingly, tunneling magneto-resistance element TMR and access transistor ATR of each reference cell RMC are connected in series between reference bit line RBL1 and a corresponding source line SL. Moreover, tunneling magneto-resistance element TMR and access transistor ATR of each spare reference cell SRMC are connected in series between reference bit line RBL2 and a corresponding source line SL. In each reference cell RMC and each spare reference cell SRMC, the gate of access transistor ATR is connected to a corresponding word line WL.

Hereinafter, the structure for selecting a row in memory array 10 will be described.

In a region adjacent to memory array 10, two transistor switches 72, 74 are provided for each memory cell row. Each transistor switch 72 drives a corresponding write digit line WDL, and each transistor switch 74 drives a corresponding word line WL. Each transistor switch 72 is connected between one end of a corresponding write digit line WDL and a node Nd, and receives a control signal WE at its gate. Each transistor switch 74 is connected between one end of a corresponding word line WL and node Nd, and receives a control signal RE at its gate. Control signal WE is activated to H level in write operation, and is otherwise inactivated to L level. Control signal RE is activated to H level in read operation, and is otherwise inactivated to L level. For example, N-channel MOS (Metal Oxide Semiconductor) transistors are used as transistor switches 72, 74.

A decode signal Rd obtained by row decoder 20 is transmitted to node Nd. Decode signal Rd is produced on a row-by-row basis. Decode signal Rd is set to H level (power supply voltage Vcc1) when a corresponding memory cell row is selected, and is otherwise set to L level (ground voltage GND). Accordingly, a common structure for generating decode signal Rd, which is included in row decoder 20, can be used for both selection of a word line WL and selection of a write digit line WDL.

In write operation, transistor switch 72 is turned ON and transistor switch 74 is turned OFF in each memory cell row. Accordingly, each word line WL is disconnected from power supply voltage Vcc1 and inactivated to L level. On the other hand, a write digit line WDL of a selected row is activated, and one end thereof is set to power supply voltage Vcc1. As a result, a data write current flows through the activated write digit line WDL in the direction from transistor switch 72 toward ground voltage GND. On the other hand, no data write current flows through write digit lines WDL of the non-selected rows because both ends of these write digit lines WDL are set to ground voltage GND.

In read operation, transistor switch 74 is turned ON and transistor switch 72 is turned OFF in each memory cell row. Therefore, a word line WL of a selected row is activated to power supply voltage Vcc1 (H level), whereas word lines WL of the non-selected rows are inactivated to ground voltage GND (L level). Moreover, each write digit line WDL is disconnected to power supply voltage Vcc1 and inactivated.

The same structure is provided for word line WL and write digit line WDL of each memory cell row.

Hereinafter, the structure for conducting write operation to memory array 10 will be described.

Read/write control circuit 30 includes a data write circuit 90 and write drivers WDVb. Write driver WDVb is provided in every memory cell column. Similarly, read/write control circuit 35 includes write drivers WDVa. Write driver WDVa is provided in every memory cell column.

Each write driver WDVa includes driver transistors DTa1, DTa0. Driver transistors DTa1, DTa0 are connected between one end of a corresponding bit line BL and power supply voltage Vcc1 and ground voltage GND, respectively. Write control signals WTa1, WTa0 are respectively applied to the gates of driver transistors DTa1, DTa0. Each write driver WDVb includes driver transistors DTb1, DTb0. Driver transistors DTb1, DTb0 are connected between the other end of a corresponding bit line BL and power supply voltage Vcc1 and ground voltage GND, respectively. Write control signals WTb1, WTb0 are respectively applied to the gates of driver transistors DTb1, DTb0. N-channel MOS transistors having relatively high current driving capability are used as driver transistors DTa0, DTa1, DTb0, DTb1 in order to supply a sufficient data write current with a small transistor size.

In each memory cell column, write driver WDVa drives one end of a corresponding bit line BL with one of power supply voltage Vcc1 and ground voltage GND according to write control signals WTa0, WTa1. Similarly, write driver WDVb drives the other end of a corresponding bit line BL with the other voltage according to write control signals WTb0, WTb1.

Data write circuit 90 controls write control signals WTa0, WTa1, WTb0, WTb1 in each memory cell column according to input data DIN to a data input terminal 4b and the column selection result.

In write operation, write control signals WTa0, WTb0 are set to H level and write control signals WTa1, WTb1 are set to L level in the non-selected columns. Accordingly, bit lines BL of the non-selected columns have their both ends connected to ground voltage GND.

In the selected column, however, one of write control signals WTa0, WTa1 is set to H level and the other write control signal is set to L level according to input data DIN. Write control signals WTb0, WTb1 are set in. a complementary manner to that of write control signals WTa0, WTa1. For example, when input data DIN is "1", write control signals WTa1, WTb0 are set to H level and write control signals WTa0, WTb1 are set to L level. As a result, a data write current is applied to a bit line BL of the selected column in the direction from write driver WDVa toward write driver WDVb. On the other hand, when input data DIN is "0", write control signals WTa0, WTb1 are set to H level and write control signals WTa1, WTb0 are set to L level. As a result, a data write current is applied to a bit line BL of the selected column in the direction from write driver WDVb toward write driver WDVa.

A data write current flowing through a write digit line WDL generates a magnetic field along the hard-axis direction in normal memory cells MC. A data write current flowing through a bit line BL in the direction corresponding to write data generates a magnetic field along the easy-axis direction in normal memory cells MC. When a data write current is applied to a write digit line WDL and a bit line BL, write data corresponding to the direction of the data write current flowing through the bit line BL is magnetically written to a corresponding memory cell MC. The same structure is provided for bit line BL of each memory cell column. Note that, in the structure of FIG. 2, a voltage other than ground voltage GND and power supply voltage Vcc1 may alternatively be used as a driving, voltage of write drivers WDVa, WDVb.

A write driver WDVd is provided at both ends of each reference bit line RBL1, RBL2. As described before, data need not be written to reference cells RMC and spare reference cells SRMC in normal operation. Therefore, write drivers WDVa, WDVb and write digit lines WDL are not necessary for reference cells RMC and spare reference cells SRMC. However, in order to ensure continuity of the shape in memory array 10 and the peripheral region thereof and simplify the manufacturing process, write drivers WDVd having the same structure as that of write drivers WDVa, WDVb are provided as dummy write drivers. For the same purpose, write digit lines WDL extend through the region corresponding to reference cells RMC and spare reference cells SRMC in addition to the region corresponding to normal memory cells MC.

Note that, in read operation, each write driver WDVa, WDVb, WDVd connects a corresponding bit line BL or a corresponding reference bit line RBL1, RBL2 to neither power supply voltage Vcc1 nor ground voltage GND.

Hereinafter, the structure for conducting read operation from memory array 10 will be described.

Read/write control circuit 30 further includes a data line DL, read selection gates RSG, and column selection gates CSG. Each read selection gate RSG is provided between data line DL and a corresponding bit line BL. Column selection gate CSG is provided in each memory cell column. Column selection gate CSG of a selected column outputs an H-level signal according to a column decode signal CDS from column decoder 25. Each read selection gate RSG receives an output signal of a corresponding column selection gate CSG at its gate.

FIG. 2 exemplarily shows column selection gates CSG1, CSG2 and read selection gates RSG1, RSG2 corresponding to the first and second memory cell columns. An output signal of column selection gate CSG1 is applied to the gate of read selection gate RSG1, and an output signal of column selection gate CSG2 is applied to the gate of read selection gate RSG2.

In read operation, a selected memory cell is therefore electrically coupled to data line DL through a bit line BL of a selected column and a corresponding read selection gate RSG.

Read/write control circuit 30 further includes a reference data line RDL and reference selection gates RFG1, RFG2. Reference selection gates RFG1, RFG2 are respectively connected between reference data line RDL and reference bit lines RBL1, RBL2. Selection signals DS1, DS2 are applied to the gates of reference selection gates RFG1, RFG2, respectively.

Generation of selection signals DS1, DS2 will be described later in detail. In operation other than read operation, selection signals DS1, DS2 are set to L level. In read operation, one of selection signals DS1 ,DS2 is selectively set to H level. Therefore, in read operation, a selected one of reference cell RMC and spare reference cell SRMC in the same memory cell row as that of the selected memory cell (hereinafter, sometimes referred to as "selected reference cell") is electrically coupled to reference data line RDL.

Read/write control circuit 30 further includes read current supply transistors 102, 106. Current supply transistors 102, 106 are provided corresponding to data line DL and reference data line RDL, respectively. Read current supply transistor 102 is connected between power supply voltage Vcc2 and data line DL, and has its gate connected to power supply voltage Vcc2. Read current supply transistor 106 is connected between power supply voltage Vcc2 and reference data line RDL, and has its gate connected to power supply voltage Vcc2.

Read current supply transistors 102, 106 have the same current driving capability. Data line DL and reference data line RDL used in read operation are thus pulled up to power supply voltage Vcc2 by the same driving capability. Accordingly, a voltage and a current corresponding to the electric resistance (Rmin or Rmax) of the selected memory cell are generated on data line DL based on access to the selected memory cell. On the other hand, a voltage and a current corresponding to the electric resistance (Rmin) of the selected reference cell are generated on reference data line RDL based on access to the selected reference cell. Hereinafter, the voltage and current on data line DL are respectively denoted with V(DL) and I(DL), and the voltage and current on reference data line RDL are respectively denoted with V(RDL) and I(RDL).

Read/write control circuit 30 further includes a data read circuit 100. Data read circuit 100 compares the voltages on data line DL and reference data line RDL with each other, and generates output data DOUT indicating storage data of the selected memory cell.

Data read circuit 100 includes sense amplifiers 110, 120, 130, 150 and a latch circuit 140. Sense amplifier 110 amplifies the voltage difference between nodes N1, N2. Sense amplifier 120 amplifies the voltage difference between nodes N1, N3. Sense amplifier 130 amplifies the voltage difference between the outputs of sense amplifiers 110, 120. Latch circuit 140 latches the output of sense amplifier 130 at a prescribed timing. Sense amplifier 150 amplifies the output of latch circuit 140 to generate output data DOUT. Output data DOUT is output from a data output terminal 4a.

Node N1 is connected to data line DL, and nodes N2, N3 are connected to reference data line RDL. Sense amplifiers 110, 120 amplify the voltage difference between V(DL) and V(RDL) with opposite polarities. More specifically, sense amplifier 110 amplifies the voltage "V(DL)-V(RDL)", whereas sense amplifier 120 amplifies the voltage "V(RDL)-V(DL)". Accordingly, the storage data level of the selected memory cell can be determined by amplifying the difference between the output voltages of sense amplifiers 110, 120 by sense amplifier 130. In view of the time required for amplifying operation of sense amplifiers 110 to 130, latch circuit 140 latches the output voltage of sense amplifier 130 at a timing after the output voltage of sense amplifier 130 reaches an amplitude of a prescribed level or more.

Figure 3:
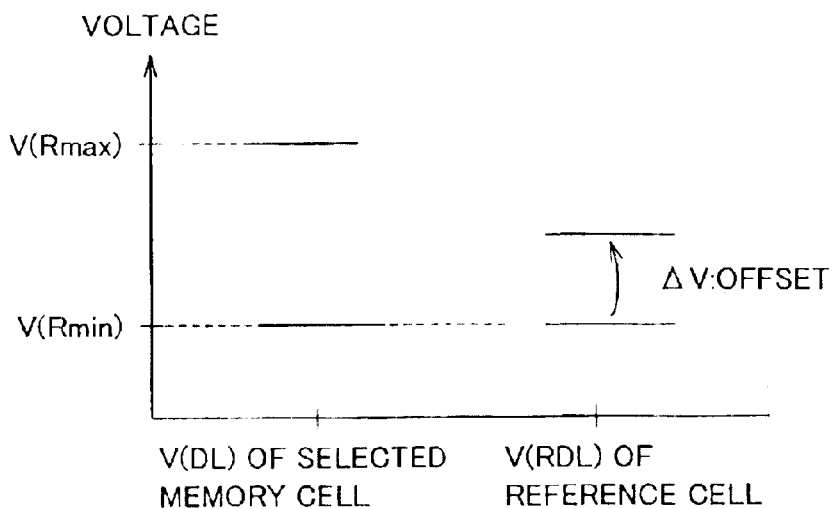
FIG. 3 is a first conceptual diagram illustrating operation of sense amplifiers of a first stage in FIG. 2.

FIG. 3 is a first conceptual diagram illustrating operation of sense amplifiers 110, 120 of the first stage.

Referring to FIG. 3, data line voltage V(DL) is settled to either V(Rmax) or V(Rmin) according to the storage data of the selected memory cell. On the other hand, reference data line voltage V(RDL) is settled to the same level as voltage V(min).

In each of sense amplifiers 110, 120, a voltage offset $\Delta V$ is applied at its one input node connected to reference data line RDL. Since a sense amplifier in which a voltage offset is applied to one of its input nodes is commonly used in the art, description of the specific structure of sense amplifiers 110, 120 is herein omitted. Voltage offset $\Delta V$ satisfies the following equation (1):

$$V(Rmin)+\Delta V<V(Rmax) \tag{1}$$

Sense amplifiers 110, 120 of the first stage may alternatively be provided as current sense amplifiers for amplifying the difference between a current passing through node N1 with a current passing through nodes N2, N3, respectively. In this case, an offset as shown in FIG. 4 must be applied in sense amplifiers 110, 120 of the first stage.

Figure 4:
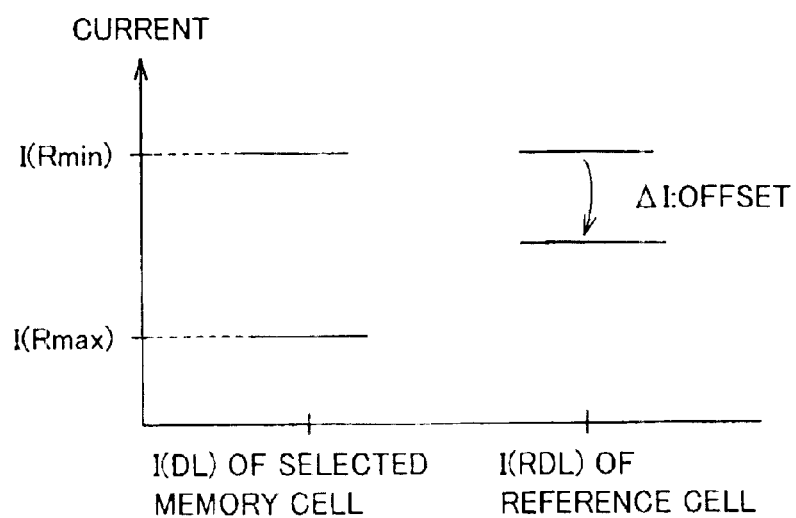
FIG. 4 is a second conceptual diagram illustrating operation of the sense amplifiers of the first stage in FIG. 2.

FIG. 4 is a second conceptual diagram illustrating operation of sense amplifiers 110, 120 of the first stage.

Referring to FIG. 4, data line current I(DL) is settled to either I(Rmax) or I(Rmin) according to the storage data of the selected memory cell. On the other hand, reference data line current I(RDL) is settled to the same level as current I(Rmin).

In each of sense amplifiers 110, 120, a current offset $\Delta I$ is applied at its one input node connected to reference data line RDL. For example, such a current offset can be implemented by providing a prescribed input impedance difference between input nodes. Since such a sense amplifier is commonly used in the art, description of the specific structure thereof is herein omitted.

Current offset $\Delta I$ satisfies the following equation (2):

$$I(Rmin)-\Delta I>I(Rmax) \tag{2}$$

Referring back to FIG. 2, it is understood from the foregoing description that data read circuit 100 reads storage data of the selected memory cell based on the comparison between the access result to the selected memory cell and the access result to the selected reference cell. Accordingly, if characteristics (electric resistance) of the selected reference cell significantly vary from a design value due to the error generated in the manufacturing process or degradation in characteristics with time, read operation accuracy is degraded.

In view of this, the MRM device of the present invention further includes a reference cell test section 80 for testing reference cells RMC (or spare reference cells SRMC). Reference cell test section 80 is provided outside memory array 10.

Reference cell test portion 80 has test units 81, 82. Test unit 81 has a test selection gate TGT1, a test resistor 85 and a dummy gate DGT1 which are connected in series between data line DL and ground voltage GND. A test selection signal TS1 is applied to the gate of test selection gate TGT1. Dummy gate DGT1 has its gate connected to power supply voltage Vcc1. Test resistor 85 is fabricated to have an electric resistance of the same level as electric resistance Rmin of tunneling magneto-resistance element TMR. Test resistor 85 is a variable resistor capable of finely adjusting its electric resistance according to an external control signal RT1.

Test unit 82 has a test selection gate TGT2, a test resistor 86 and a dummy gate DGT2 which are connected in series between data line DL and ground voltage GND. A test selection signal TS2 is applied to the gate of test selection gate TGT2. Dummy gate DGT2 has its gate connected to power supply voltage Vcc1. Test resistor 86 is fabricated to have an electric resistance of the same level as electric resistance Rmax of tunneling magneto-resistance element TMR. Test resistor 86 is a variable resistor capable of finely adjusting its electric resistance according to an external control signal RT2.

Each dummy gate DGT1, DGT2 has the same design as that of access transistor ATR. The ON-state resistance of each dummy gate DGT1, DGT2 is the same as the resistance of access transistor ATR in the ON state. Each test selection gate TGT1, TGT2 has the same design as that of read selection gate RSG. The ON-state resistance of each test selection gate TGT1, TGT2 is the same as the resistance of read selection gate RSG in the ON state.

In operation test, one of test selection signals TS1, TS2 is set to H level, and a word line WL corresponding to a reference cell RMC or spare reference cell SRMC to be tested is activated. On the other hand, each read selection gate RSG corresponding to normal memory cells MC is turned OFF.

As a result, a voltage and a current are generated on data line DL based on access to test unit 81 or 82. This voltage and current are settled to the level corresponding to the electric resistance of test resistor 85 or 86 (i.e., near Rmax or near Rmin).

One of selection signals DS1, DS2 is selectively set to H level. As a result, a voltage and a current are generated on reference data line RDL based on access to one of reference cell RMC and spare reference cell SRMC corresponding to the activated word line WL. This voltage and current are settled to the level corresponding to the electric resistance of reference cell RMC (or spare reference cell SRMC) to be tested. Accordingly, provided that reference cell RMC (or spare reference cell SRMC) to be tested has a normal electric resistance, the data level corresponding to electric resistance Rmin is obtained as output data DOUT from data read circuit 100 when test unit 81 is selected. When test unit 82 is selected, the data level corresponding to electric resistance Rmax is obtained as output data DOUT from data read circuit 100.

Figure 5:
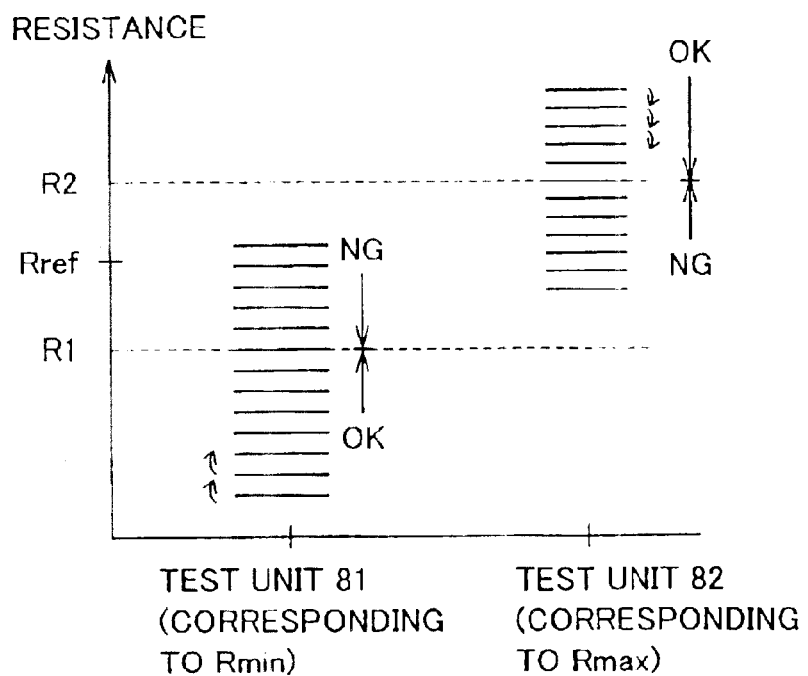
FIG. 5 is a first conceptual diagram illustrating an operation test method of reference cells.
Figure 6:
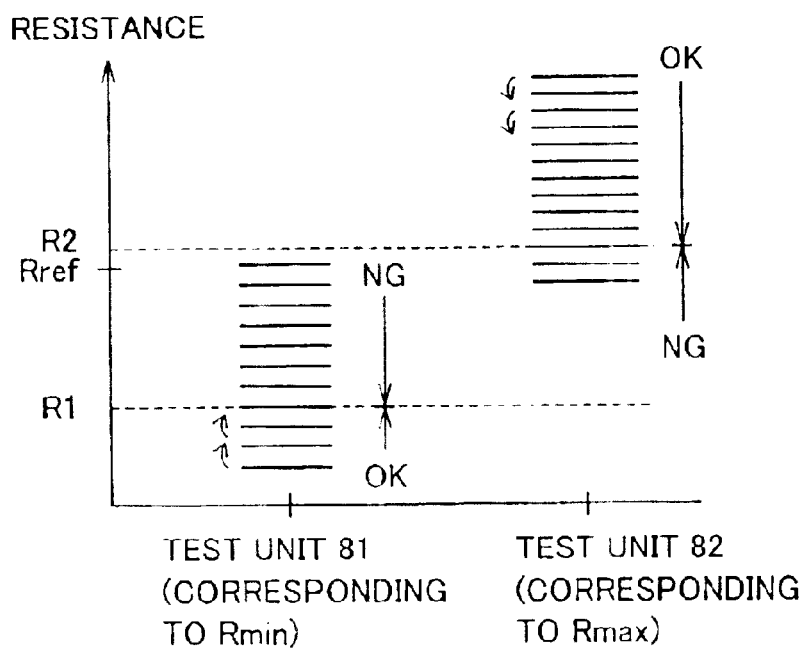
FIG. 6 is a second conceptual diagram illustrating an operation test method of reference cells.

FIGS. 5 and 6 are conceptual diagrams illustrating an operation test method of a reference cell.

FIG. 5 shows an example of the test result obtained when a reference cell RMC (spare memory cell SRMC) to be tested has normal characteristics. FIG. 6 shows an example of the test result obtained when a reference cell RMC (spare reference cell SRMC) to be tested has abnormal characteristics.

Referring to FIGS. 5 and 6, when test unit 81 having test resistor 85 corresponding to electric resistance Rmin is selected, the electric resistance of test resistor 85 is gradually increased according to control signal RT1 in order to obtain an electric resistance R1 of test resistor 85 at which the level of output data DOUT is inverted, that is, at which erroneous reading occurs. Similarly, when test unit 82 having test resistor 86 corresponding to electric resistance Rmax is selected, the electric resistance of test resistor 86 is gradually reduced according to control signal RT2 in order to obtain an electric resistance R2 of test resistor 86 at which the level of output data DOUT is inverted, that is, at which erroneous reading occurs.

Characteristics of reference cell RMC (spare reference cell SRMC) to be tested can be evaluated by comparing an average (intermediate value) of electric resistances R1, R2 thus obtained with a reference resistance Rref (Rref= (Rmax+Rmin)/2).

More specifically, if reference cell RMC (spare reference cell SRMC) to be tested has normal characteristics, the intermediate value (average) of electric resistances R1, R2 approximately matches reference resistance Rref, as shown in FIG. 5. As shown in FIG. 6, however, if reference cell RMC (spare reference cell SRMC) to be tested has defective characteristics, the intermediate value (average) of electric resistances R1, R2 does not match reference resistance Rref, and reference resistance Rref is close to one of electric resistances R1, R2.

A defective reference cell RMC (or spare reference cell SRMC) can thus be detected by evaluating characteristics of each reference cell RMC (or each spare reference cell SRMC) in reference cell test portion 80. Selection of a reference cell RMC and a spare reference cell SRMC can be conducted according to the test result of reference cells RMC.

Figure 7:
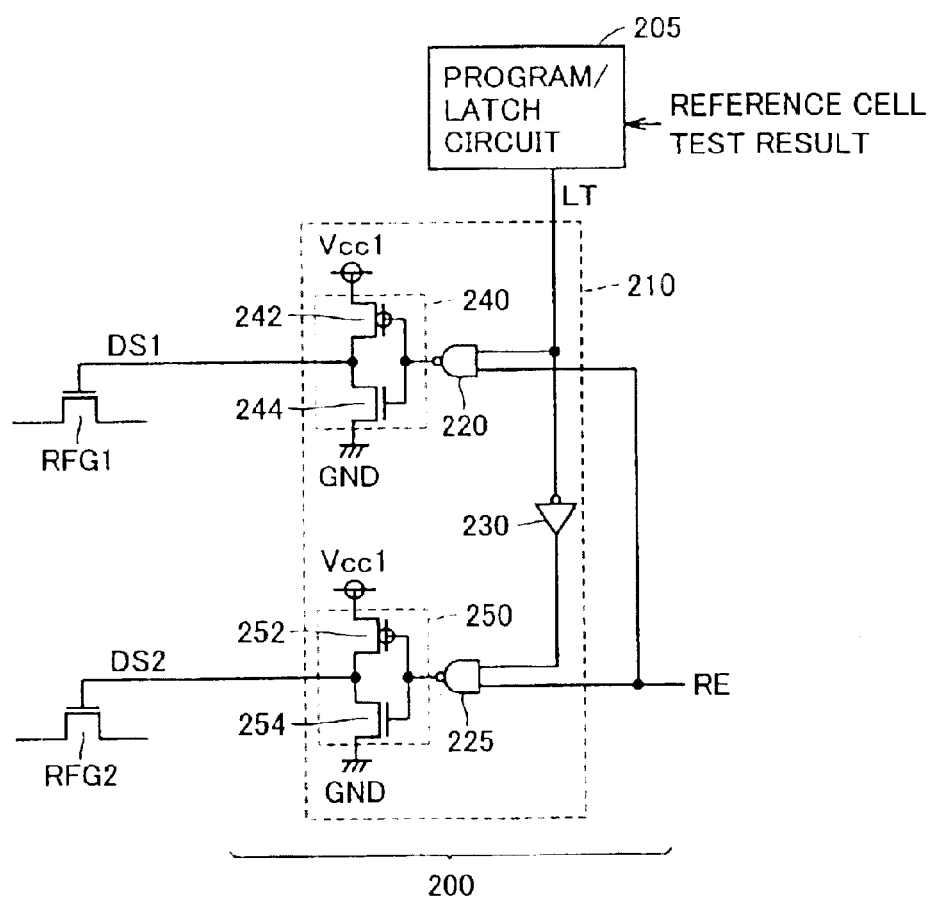
FIG. 7 is a block diagram showing a first example of the structure of a reference cell selecting section according to the first embodiment.

Referring to FIG. 7, a reference cell selecting section 200 includes a program/latch circuit 205 and a selection signal generating section 210. Program/latch circuit 205 has a program element (not shown) for storing in a non-volatile manner the reference cell test result which indicates whether or not there is a defective reference cell in reference cell column 51.

Program/latch circuit 205 generates a latch signal LT by reading storage data of the program element upon power-on of MRAM device 1. Latch signal LT is set to H level when there is no defective reference cell in reference cell column 51. Latch signal LT is set to L level when there is a defective reference cell in reference cell column 51 and spare reference cell column 52 must be used.

Selection signal generating section 210 includes a logic gate 220, an inverter 230, a logic gate 225 and signal generating units 240, 250. Logic gate 220 outputs the NAND operation result of latch signal LT and control signal RE. Inverter 230 inverts latch signal LT. Logic gate 225 outputs the NAND operation result of the inverted latch signal from inverter 230 and control signal RE.

Signal generating unit 240 includes a P-channel MOS transistor 242 and an N-channel MOS transistor 244 which are connected in series between power supply voltage Vcc1 and ground voltage GND. Transistors 242, 244 receive the output signal of logic gate 220 at their gates. Selection signal DS1 is generated at the connection node of transistors 242, 244, and is applied to the gate of reference selection gate RFG1. Similarly, signal generating unit 250 includes a P-channel MOS transistor 252 and an N-channel MOS transistor 254 which are connected in series between power supply voltage Vcc1 and ground voltage GND. Transistors 252, 254 receive the output signal of logic gate 225 at their gates. Selection signal, DS2 is generated at the connection node of transistors 252, 254, and is applied to the gate of reference selection gate RFG2.

With the above structure, selection signals DS1, DS2 are inactivated to L level in operation other than read operation, that is, in operation in which control signal RE is inactivated to L level. On the other hand, in read operation in which control signal RE is activated to H level, selection signal DS1 is activated to H level and selection signal DS2 is inactivated to L level when latch signal LT is set to H level. However, when latch signal LS is set to L level, selection signal DS2 is activated to H level and selection signal DS1 is inactivated to L level.

If reference cell column 51 includes no defective reference cell, reference selection gate RFG1 is turned ON, and one of reference cells RMC which corresponds to the same memory cell row as that of the selected memory cell is connected to reference data line RDL and accessed. On the other hand, if reference cell column 51 includes a defective reference cell in the same memory cell row as that of the selected memory cell, reference selection gate RFG2 is turned ON and a spare reference cell SRMC corresponding to the same memory cell row as that of the defective reference cell RMC is connected to reference data line DL and accessed.

The program element may be formed as a rewritable storage element by using an additional MTJ memory cell or the like. In this case, even after the MRAM device is shipped, selection of a reference cell RMC and a spare reference cell SRMC can be switched according to the result of the operation test of the reference cells conducted after the MRAM device is used.

Alternatively, selection of a reference cell RMC and a spare reference cell SRMC may be appropriately switched during operation of the MRAM device according to input conditions and operation conditions, as described below.

Figure 8:
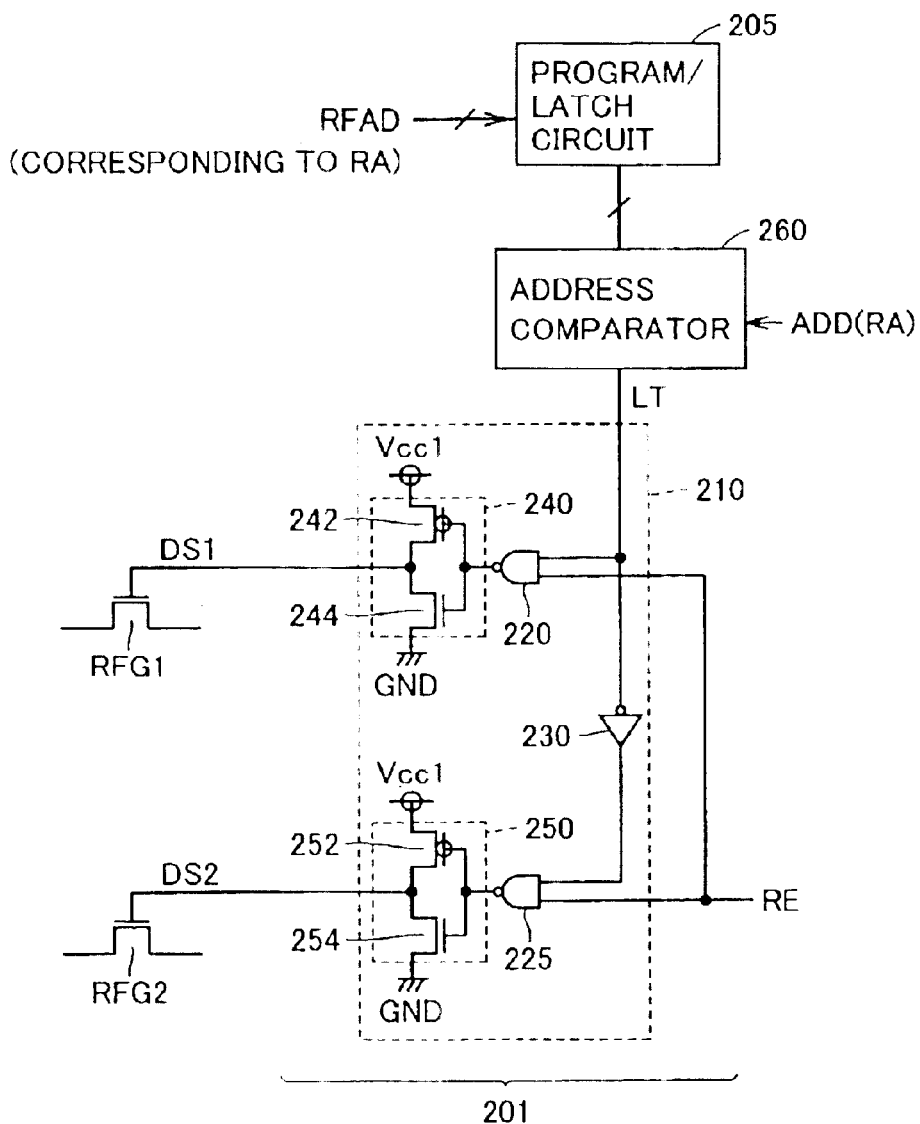
FIG. 8 is a block diagram showing a second example of the structure of the reference cell selecting section according to the first embodiment.

FIG. 8 is a block diagram showing another example of the structure of the reference cell selecting section.

Referring to FIG. 8, a reference cell selecting section 201 includes a program/latch circuit 205, an address comparator 260, and a selection signal generating section 210. Program/latch circuit 205 stores a defective address RFAD indicating a region including a defective reference cell. As shown in FIG. 2, in the first embodiment, reference cells RMC are arranged in reference cell column 51. Therefore, the defective address is determined according to a row address RA.

Defective address RFAD is generated based on the result of the operation test of the reference cells. Note that the functions of program/latch circuit 205 and the operation test of the reference cells are the same as those described in connection with FIG. 7, detailed description thereof will not be repeated Address comparator 260 compares defective address RFAD with address signal ADD in order to determine whether or not defective address RFAD matches address signal ADD. If defective address RFAD matches address signal ADD (row address RA), address comparator 260 sets latch signal LT to H level. If defective address RFAD does not match address signal ADD (row address RA), address comparator 260 sets latch signal LT to L level. Selection signal generating section 210 generates selection signals DS1, DS2 based on latch signal LT and control signal RE in the same manner as that described in connection with FIG. 7.

As has been described above, in the first embodiment, spare reference cells SRMC are provided for reference cells RMC. Moreover, selection of a reference cell RMC and a spare reference cell SRMC is not fixed based on the result of the operation test of the reference cells conducted before the MRAM device is used, but cab be dynamically switched according to input conditions of an address signal or the like based on the result of the operation test of the reference cells conducted after the MRAM device is shipped.

Accordingly, even if characteristics of a reference cell are varied in the manufacturing process or degraded with time, such a defective reference cell can be detected and replaced with a spare reference cell. This ensures stable read operation. Moreover, the life of the MRAM device can be extended in terms of degradation of the reference cells with time.

First Modification of First Embodiment

Hereinafter, variations of the structure of the reference cell selecting section for selecting a reference cell and a spare reference cell will be described as modifications of the first embodiment.

Figure 9:
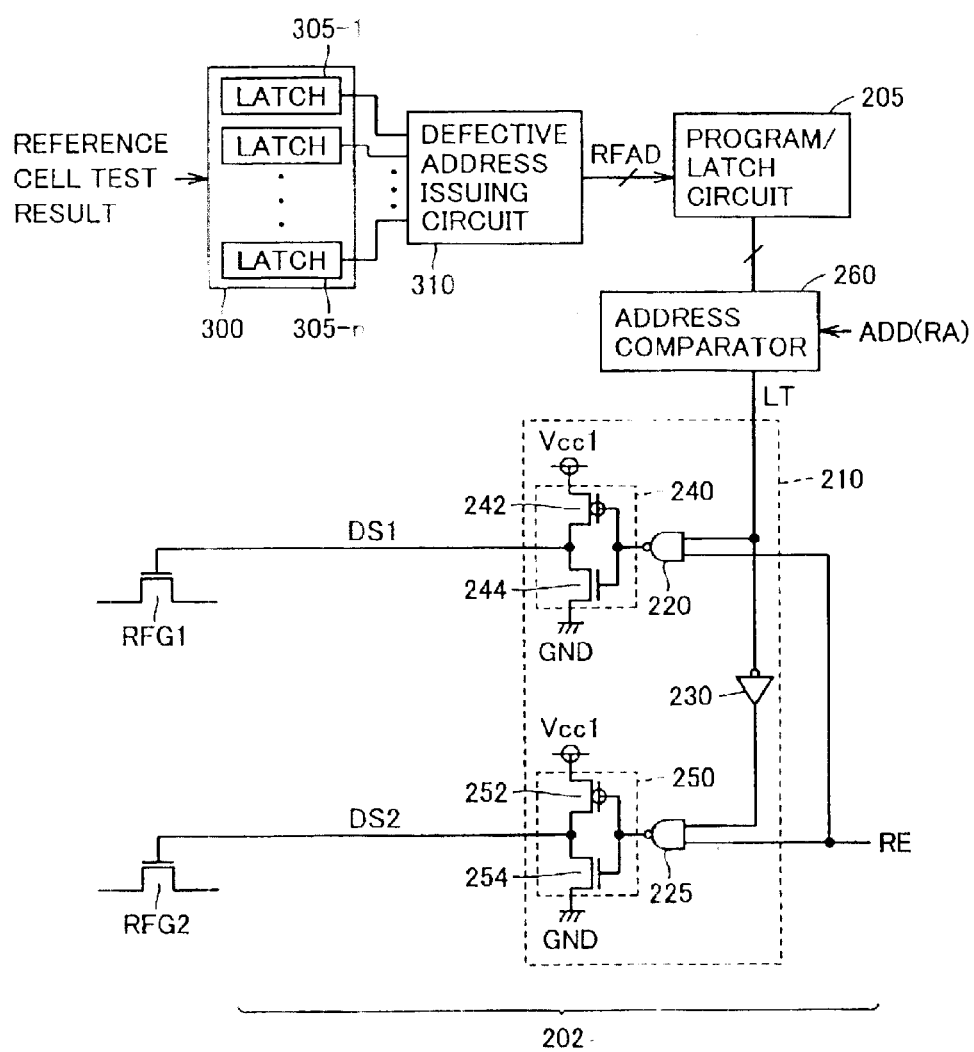
FIG. 9 is a block diagram showing the structure of a reference cell selecting section according to a first modification of the first embodiment.

Referring to FIG. 9, a reference cell selecting section 202 according to a first modification of the first embodiment is different from reference cell selecting section 201 of FIG. 8 in that reference cell selecting section 202 further includes a test result storage circuit 300 and a defective address issuing circuit 310. Test result storage circuit 300 includes n latch circuits 305-1 to 305-n (where n is a natural number).

A plurality of normal memory cells MC in memory array 10 is divided in advance into n address segments. In the first embodiment, reference cells RMC are arranged in a reference cell column. Therefore, each address segment has a prescribed number of memory cell rows.

Each latch circuit 305-1 to 305-n stores the operation test result of the reference cells in a corresponding address segment. The operation test of the reference cells is conducted in response to power-on of MRAM device 1 in the manner described above. In other words, the operation test result of the reference cells corresponding to each address segment is stored in test result storage circuit 300 every time power is applied to MRAM device 1.

Defective address issuing circuit 310 obtains a row address corresponding to an address segment of a defective reference cell based on the operation test result latched in latch circuits 305-1 to 305-n, and stores this row address in program/latch circuit 205 as a defective address RFAD.

Program/latch circuit 205 stores defective address RFAD received from defective address issuing circuit 310 at least during power-on of MRAM device 1. Since selection signals DS1, DS2 are generated according to defective address RFAD in the same manner as that described in connection with FIG. 8, detailed description thereof will not be repeated.

Since reference cells RMC are accessed more frequently than the normal memory cells, characteristics of reference cells RMC are more likely to be degraded with time. In the above structure, operation test of reference cells RMC is conducted every time power is applied to the MRAM device, and a defective reference cell can be replaced with a spare reference cell.

Moreover, selection of a reference cell and a spare reference cell can be independently conducted in each address segment. This enables efficient use of the spare reference cells.

Accordingly, read operation accuracy of the MRAM device can be retained even if characteristics of reference cells are degraded with time due to frequent access. This improves operation reliability and extends the life of the MRAM device.

Second Modification of First Embodiment

Figure 10:
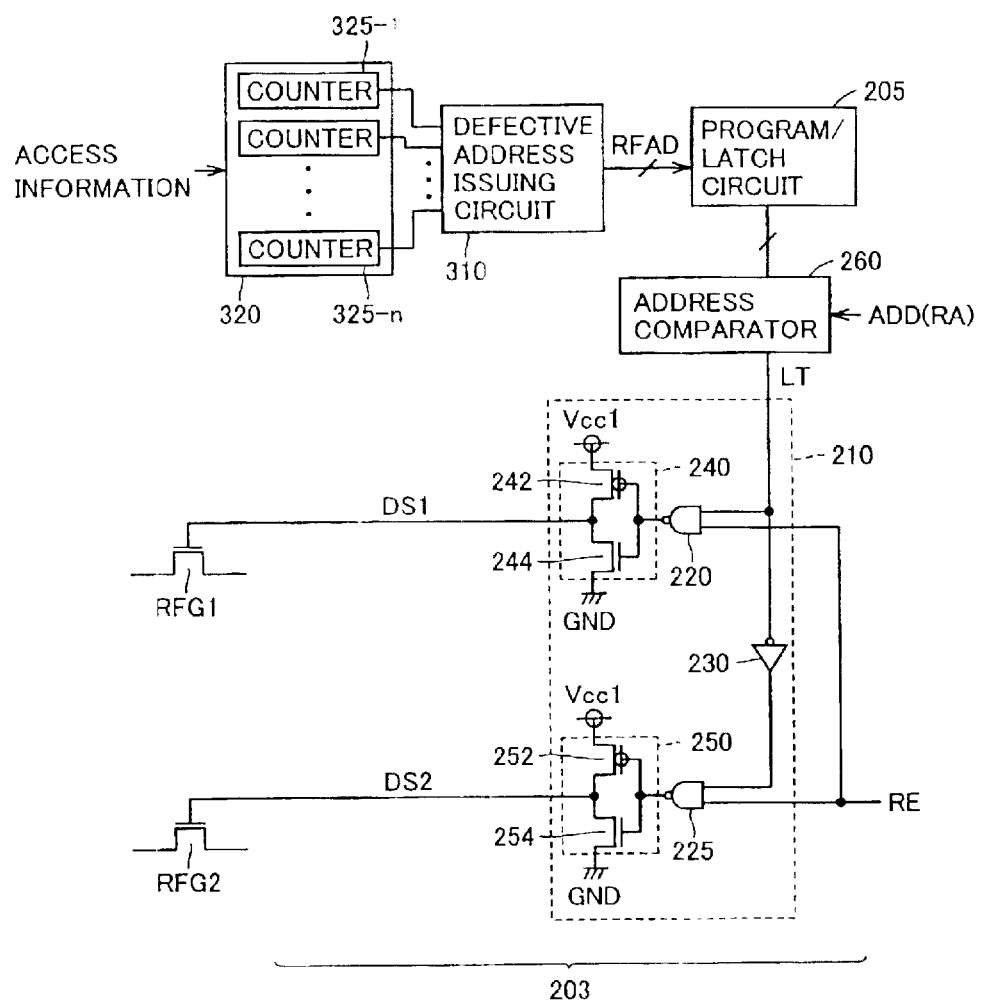
FIG. 10 is a block diagram showing the structure of a reference cell selecting section according to a second modification of the first embodiment.

Referring to FIG. 10, a reference cell selecting section 203 according to a second modification of the first embodiment is different from reference cell selecting section 202 of FIG. 9 in that test result storage circuit 300 is replaced with an access frequency storage circuit 320. Since the structure of reference cell selecting section 203 is otherwise the same as that of reference cell selecting section 202 of FIG. 9, detailed description thereof will not be repeated.

Access frequency storage circuit 320 includes counters 325-1 to 325-n corresponding to n address segments. Access frequency storage circuit 320 receives access information that indicates which one of the n address segments is to be accessed. Each counter 325-1 to 325-n stores count data and increments the count data every time a corresponding address segment is accessed. Accordingly, each counter 325-1 to 325-n stores in a non-volatile manner the total number of times a corresponding address segment has been accessed so far.

When the count data of any counter 325-1 to 325-n exceeds a prescribed threshold value, defective address issuing circuit 310 stores a defective address RFAD indicating a corresponding address segment in program/latch circuit 205. Since selection signals DS1, DS2 are generated according to defective address RFAD in the same manner as that described in connection with FIG. 8, detailed description thereof will not be repeated.

If an address segment is accessed more than a prescribed threshold number of times, characteristics of the reference cells in that access segment may be degraded. In the above structure, the total number of times each reference cell has been accessed is counted. As a result, in an address segment which has been accessed more than the predetermined threshold number of times, read operation can be conducted using a spare reference cell instead of a reference cell.

In this way, degradation in characteristics of each reference cell with time caused by frequent access is predicted, and the reference cell is replaced with a spare reference cell before the reference cell actually becomes defective. This enables further improvement in operation reliability.

Second Embodiment

Figure 11:
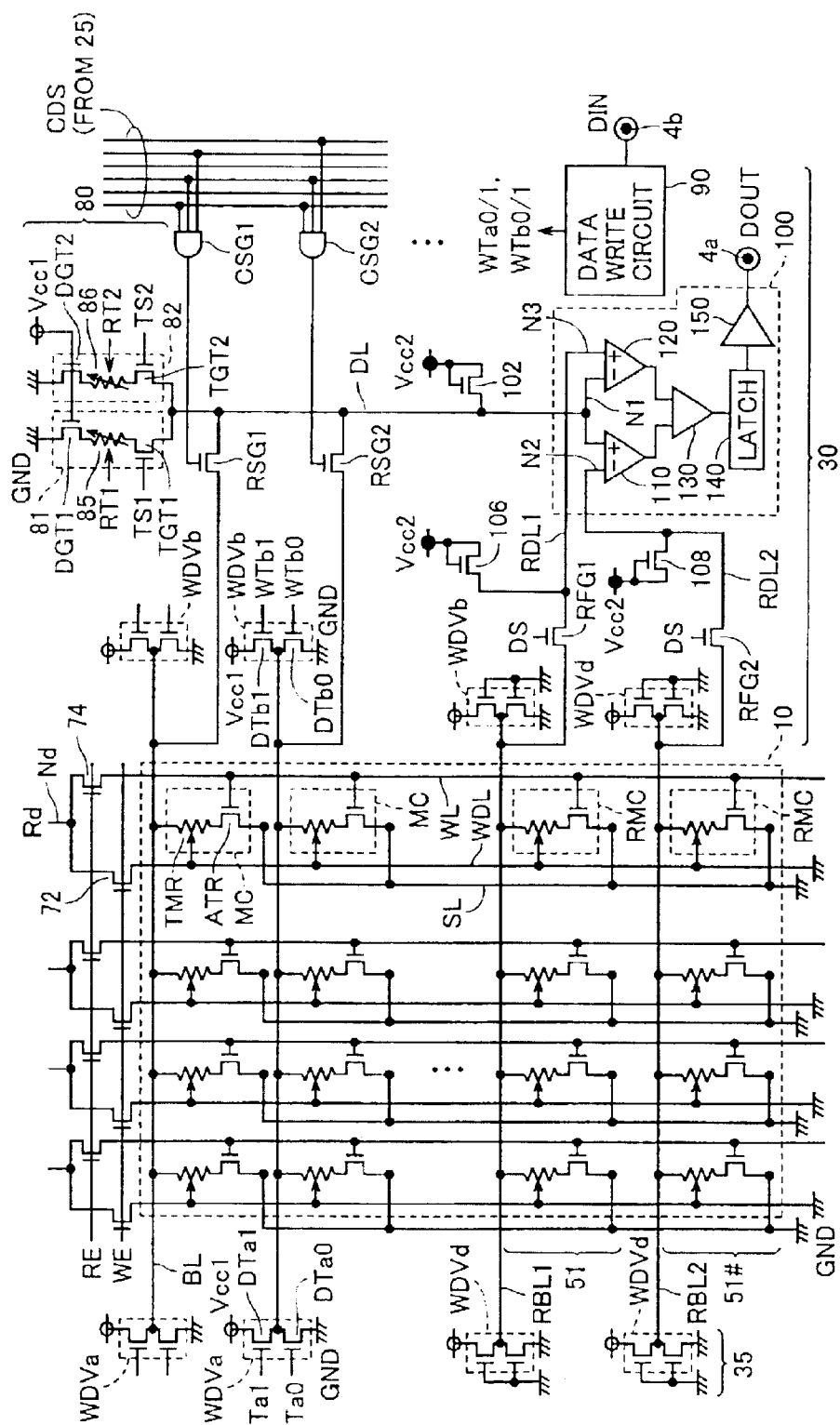
FIG. 11 is a circuit diagram showing the structure of a memory array and a peripheral circuit group for conducting read and write operations according to a second embodiment of the present invention.

FIG. 11 is a circuit diagram showing the structure of memory array 10 and the peripheral circuit group for conducting read and write operations according to the second embodiment of the present invention.

Referring to FIG. 11, the structure of the second embodiment is different from that of the first embodiment in FIG. 2 in that a plurality of reference cells RMC are simultaneously accessed.

In the second embodiment, two reference cell columns 51, 51# are provided for normal memory cells MC. Reference cells RMC in reference cell columns 51, 51# share the memory cell rows with normal memory cells MC. A reference bit line RBL1 is provided for reference cell column 51, and a reference bit line RBL2 is provided for reference cell column 51#.

Reference data lines RDL1, RDL2 are respectively provided for reference bit lines RBL1, RBL2. A reference selection gate RFG1 is connected between reference data line RDL1 and reference bit line RBL1. A reference selection gate RFG2 is connected between reference data line RDL2 and reference bit line RBL2. A common selection signal DS is applied to the gates of reference selection gates RFG1, RFG2. Selection signal DS is activated to H level in read operation, and is inactivated to L level in write operation.

Read current supply transistors 106, 108 are respectively provided for reference data lines RDL1, RDL2. Read current supply transistor 106 is electrically coupled between power supply voltage Vcc2 and reference data line RDL1, and has its gate connected to power supply voltage Vcc2. Read current supply transistor 108 is electrically coupled between power supply voltage Vcc2 and reference data line RDL2, and has its gate connected to power supply voltage Vcc2.

In data read circuit 100 of the second embodiment, node N1 is connected to data line DL as in the first embodiment. However, nodes N2, N3 are connected to reference data lines RDL2, RDL1, respectively.

In read operation, a normal memory cell MC is selected in the same manner as that of the first embodiment. More specifically, data line DL is coupled to the selected memory cell through a bit line BL and a read selection gate RSG of the selected column. As a result, a current and a voltage corresponding to storage data of the selected memory cell are generated on data line DL.

In read operation of the second embodiment, two reference cells RMC are accessed and compared with the selected memory cell. Since the structure and operation of sense amplifiers 110, 120 and the following stages in data read circuit 100 are the same as those of the first embodiment, detailed description thereof will not be repeated. Moreover, since the circuit structure for conducting write operation and the operation of the circuit structure are the same as those of the first embodiment, detailed description thereof will not be repeated.

With the above structure, even if one of a plurality of reference cells RMC to be accessed simultaneously have unsatisfactory characteristics and therefore the output of sense amplifier 110 or 120 have an insufficient amplitude, sense amplifier 130 can normally output a level corresponding to the storage data of the selected memory cell as long as the output of the other sense amplifier 110, 120 has a sufficient amplitude.

As a result, possibility of erroneous reading can be suppressed even if the electric resistance of a reference cell RMC varies from a reference value Rref. In other words, operation reliability of the MRAM device can be improved in terms of manufacturing variation in characteristics of the reference cells and degradation in characteristics of the reference cells with time.

Modification of Second Embodiment

Figure 12:
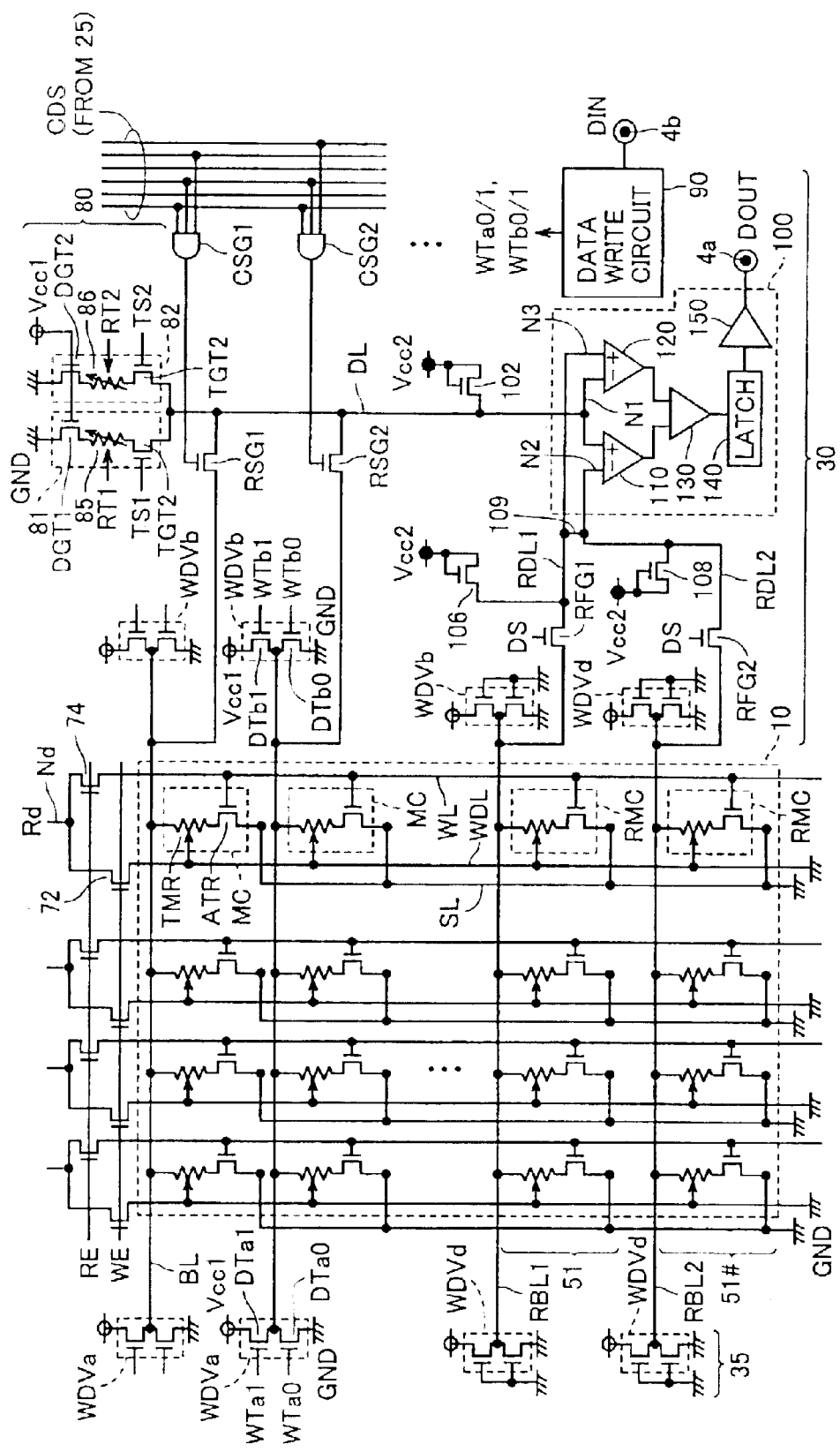
FIG. 12 is a circuit diagram showing the structure of a memory array and a peripheral circuit group for conducting read and write operations according to a modification of the second embodiment.

FIG. 12 is a circuit diagram showing the structure of memory array 10 and the peripheral circuit group for conducting read and write operations according to a modification of the second embodiment.

Referring to FIG. 12, the structure of the modification of the second embodiment is different from that of the second embodiment in FIG. 11 in that reference data lines RDL1, RDL2 are electrically connected to each other by a connection node 109 right before nodes N2, N3 corresponding to the input nodes of sense amplifiers 110, 120. Since the structure of the modification of the second embodiment is otherwise the same as that of FIG. 11, detailed description thereof will not be repeated.

With the above structure, an average of voltages or currents generated on reference data lines RDL1, RDL2 according to a plurality of simultaneously accessed reference cells RMC can be applied to sense input nodes N2, N3. As a result, even if characteristics (electric resistance) of a reference cell RMC are varied, the influence of such variation can be reduced. For example, in the structure of FIG. 12, two reference cells RMC are simultaneously accessed, and therefore the influence of such variation can be reduced by half.

As a result, even if characteristics of the reference cells are varied in the manufacturing process or degraded with time, the influence of such variation is suppressed and read operation accuracy can be ensured. This enables improvement in operation reliability of the MRAM device.

Note that, in the second embodiment and the modification thereof, two reference cells RMC are simultaneously accessed in read operation. However, the present invention is not limited to this. Three or more reference cells may be simultaneously accessed in read operation, and read operation may be conducted based on the comparison between access to these reference cells and access to the selected memory cell.

The structure of the second embodiment and the modification thereof (the structure in which a plurality of reference cells are simultaneously accessed) may be combined with the structure of the first embodiment (the structure characterized in that spare reference cells are provided for reference cells and selection of a reference cell and a spare reference cell is dynamically switched). In this case, the structure of FIGS. 11 and 12 are required to be modified as follows: spare reference cells are provided for the reference cells of reference cell columns 51, 51#. Moreover, a selection signal DS for reference cell columns 51, 51# and a selection signal DS for a not-shown spare reference cell column are controlled and generated in the same manner as that of selection signals DS1, DS2 of the first embodiment and the modifications thereof. In this way, a spare reference cell column which can be dynamically switched with a reference cell column can be provided in the structure of the second embodiment and the modification thereof.

Third Embodiment

In the third embodiment, reference cells are arranged in a reference cell row along the row direction.

Figure 13:
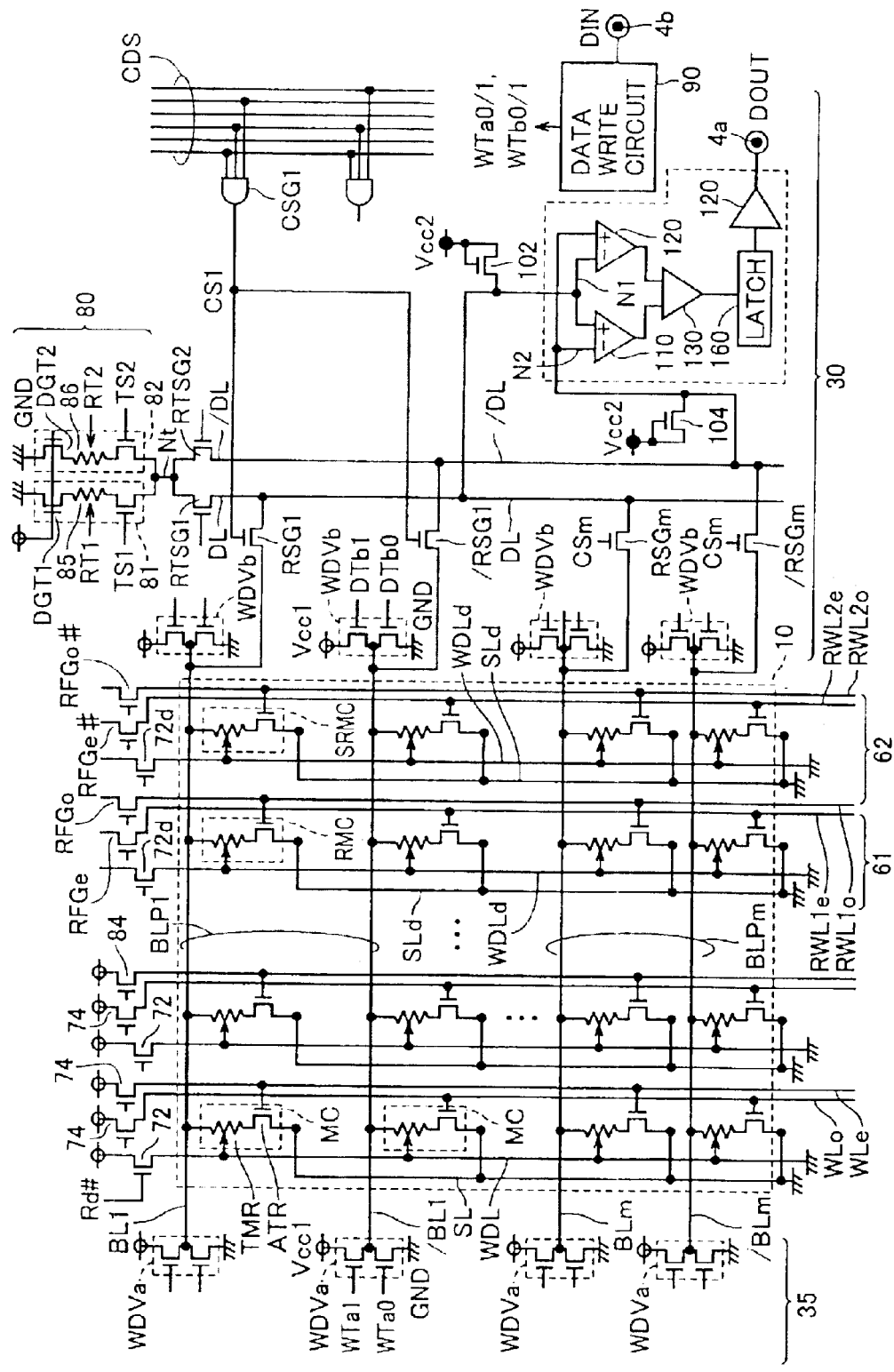
FIG. 13 is a circuit diagram showing the structure of a memory array and a peripheral circuit group for conducting read and write operations according to a third embodiment of the present invention.

FIG. 13 is a circuit diagram showing the structure of memory array 10 and the peripheral circuit group for conducting read and write operations according to the third embodiment of the present invention.

Referring to FIG. 13, in the third embodiment, normal memory cells MC are arranged in a matrix in the same manner as that of FIG. 2, and reference cells RMC and spare reference cells SRMC are provided for normal memory cells MC. Reference cells RMC are arranged in a reference cell row 61 along the row direction. Spare reference cells SRMC are arranged in a spare reference cell row 62 along the row direction.

Reference cells RMC and spare reference cells SRMC share the memory cell columns with normal memory cells MC. Bit line pairs BLP1 to BLPm are provided corresponding to the shared memory cell columns. Each bit line pair BLP1 to BLPm has complementary bit lines BL, /BL. For example, bit line pair BLP1 has complementary bit lines BL1, /BL1.

Two write drivers WDVa, WDVb are provided for each bit line BL, /BL. Data write circuit 90 supplies write control signals WTa0, WTa1, WTb0, WTb1 to each write driver WDVa, WDVb in the same manner as that of the first embodiment.

Normal memory cells MC are arranged alternately in every row. More specifically, normal memory cells MC are connected to bit lines BL in even rows, and connected to bit lines /BL in odd rows. In FIG. 13, one of the word lines corresponding to odd rows is denoted with "WLo", and one of the word lines corresponding to even rows is denoted with "WLe".

Since two write drivers WDVa, WDVb are provided for each bit line BL, /BL, a write digit line WDL need only be provided in every two rows. Accordingly, a transistor switch 72 is provided between power supply voltage Vcc1 and one end of each write digit line WDL. A decode signal Rd# is generated in every two rows, and each transistor switch 72 receives decode signal Rd# at its gate.

A transistor switch 74 is connected between each word line WLe, WLo and power supply voltage Vcc1. Each transistor switch 74 receives at its gate a decode signal (not shown) indicating the selection result of a corresponding row.

Hereinafter, arrangement of signal lines for the reference cells and the spare reference cells will be described Reference word lines RWL1e, RWL1o are provided for reference cell row 61. 2m reference cells RMC are provided in total. These reference cells RMC are respectively connected to bit lines BL1, /BL1 to BLm, /BLm.

Similarly, reference word lines RWL2e, RWL2o are provided for spare reference cell row 62. 2m spare reference cells SRMC are provided in total. These spare reference cells SRMC are respectively connected to bit lines BL1, /BL1 to BLm, /BLm.

In reference cell row 61, access transistor ATR of reference cell RMC connected to bit line BL has its gate connected to reference word line RWL1o. On the other hand, access transistor ATR of reference cell RMC connected to bit line /BL has its gate connected to reference word line RWL1e. Similarly, in spare reference cell row 62, access transistor ATR of spare reference cell SRMC connected to bit line BL has its gate connected to reference word line RWL2o. On the other hand, access transistor ATR of spare reference cell SRMC connected to bit line /BL has its gate connected to reference word line RWL2e.

These reference word lines RWL1e, RWL1o, RWL2e, RWL2o are sometimes generally referred to as reference word lines RWL. Selection of a reference word line RWL will be described later in detail.

Transistor switches 72d are not required from the standpoint of functions. However, transistor switches 72d are herein provided as dummy transistor switches in order to ensure continuity of the shape in the peripheral region of the memory array and simplify the manufacturing process.

In the third embodiment, complementary data lines DL, /DL are provided. Read selection gates RSG1 to RSGm are provided between data line DL and bit lines BL1 to BLm, respectively. Similarly, read selection gates /RSG1 to /RSGm are provided between data line /DL and bit lines /BL1 to /BLm, respectively. Hereinafter, read selection gates RSG1 to RSGm are sometimes generally referred to as read selection gates RSG, and read selection gates /RSG1 to /RSGm are sometimes generally referred to as read selection gates /RSG. Read current supply transistors 102, 104 are respectively provided for data lines DL, /DL.

A common column selection signal is applied to the gates of read selection gates RSG, /RSG of the same memory cell column. For example, a common column selection signal CS1 is applied from a column selection gate CSG1 to the gates of read selection gates RSG1, /RSG1 of the first memory cell column. Accordingly, bit lines BL, /BL of a selected column are respectively connected to data lines DL, /DL according to the column selection result.

A reference cell test section 80 includes the same test units 81, 82 as those of FIG. 2. Test units 81, 82 are connected in parallel between a node Nt and ground voltage GND. Reference test selection gates RTSG1, RTSG2 are connected between node Nt and data lines DL, /DL, respectively. Test selection signals TS1, TS2 described before are applied to the gates of reference test selection gates RTSG1, RTSG2, respectively.

In the operation test of reference cells RMC, each word line WL corresponding to normal memory cells MC is inactivated, and a reference word line RWL corresponding to a reference cell RMC or spare reference cell SRMC to be tested is selectively activated. As a result, reference cell RMC (or spare reference cell SRMC) to be tested is connected to one of data lines DL, /DL. In order to connect one of test units 81, 82 to the other data line DL, /DL, one of reference test selection gates RTSG1, RTSG2 is selectively turned ON in response to test selection signals TS1, TS2. Whether to turn ON reference test selection gate RTSG1 or RTSG2 is determined according to selection of reference word line RWL.

As a result, reference cell RMC (or spare reference cell SRMC) to be tested is connected to one of data lines DL, /DL, and test unit 81 or 82 is connected to the other data line DL, /DL. Therefore, the operation test for evaluating reference cell characteristics can be conducted by the same method as that described in FIGS. 5 and 6.

Hereinafter, selection of a reference word line in read operation, that is, selection of a reference cell and a spare reference cell in read operation, will be described.

Figure 14:
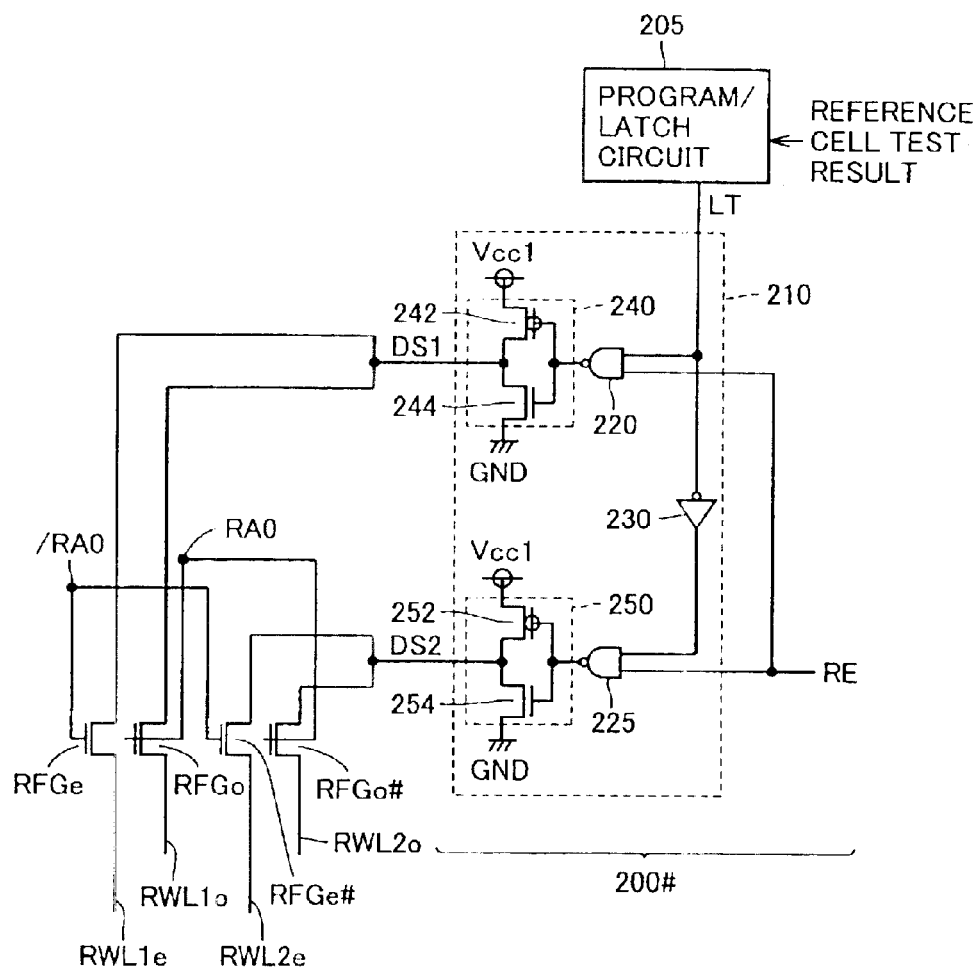
FIG. 14 is a block diagram showing a first example of the structure of a reference cell selecting section according to the third embodiment.

FIG. 14 is a block diagram showing a first example of the structure of a reference cell selecting section according to the third embodiment.

Referring to FIG. 14, a reference cell selecting section 200# of the first example includes a program/latch circuit 205 and a selection signal generating section 210. As described in FIG. 7, program/latch circuit 205 stores the operation test result of the reference cells. In other words, program/latch circuit 205 stores information indicating whether or not there is a defective reference cell in reference cell row 61, that is, whether or not spare reference cell row 62 must be used.

As described before, in read operation (an H-level period of control signal RE), selection signal generating section 210 activates one of selection signals DS1, DS2 to H level and inactivates the other selection signal DS1, DS2 to L level according to a latch signal LT received from program/latch circuit 205.

Selection signal DS1 is transmitted to reference word lines RWL1e, RWL1o through reference selection gates RFGe, RFGo, respectively. Similarly, selection signal DS2 is transmitted to reference word lines RWL2e, RWL2o through reference selection gates RFGe#, RFGo#, respectively.

Reference selection gates RFGo, RFGo# are turned ON in response to an address bit RA0. Address bit RA0 is activated to H level when an odd row is selected. Reference selection gates RFGe, RFGe# are turned ON in response to an address bit /RA0. Address bit /RA0 has an inverted level of address bit RA0.

When reference cell row 61 is selected by reference cell selecting section 200# and an even row is selected, reference word line RWL1e is activated to H level and the remaining reference word lines are inactivated. When reference cell row 61 is selected and an odd row is selected, reference word line RWL1o is activated to H level and the remaining reference word lines are inactivated.

On the other hand, when spare reference cell row 62 is selected by reference cell selecting section 200# and an even row is selected, reference word line RWL2e is activated to H level and the remaining reference word lines are inactivated. When spare reference cell row 62 is selected and an odd row is selected, reference word line RWL2o is activated to H level and the remaining reference word lines are inactivated.

Accordingly, if reference cell row 61 includes no defective reference cell RMC, reference selection gate RFGo or RFGe is turned ON, and one of reference cells RMC which corresponds to the same memory cell column as that of the selected memory cell is connected to reference data line RDL and accessed. On the other hand, if reference cell row 61 includes a defective reference cell RMC in the same memory cell column as that of the selected memory cell, reference selection gate RFGo# or RFGE# is turned ON, and a spare reference cell SRMC corresponding to the same memory cell column as that of the defective reference cell RMC is connected to reference data line RDL and accessed.

Figure 15:
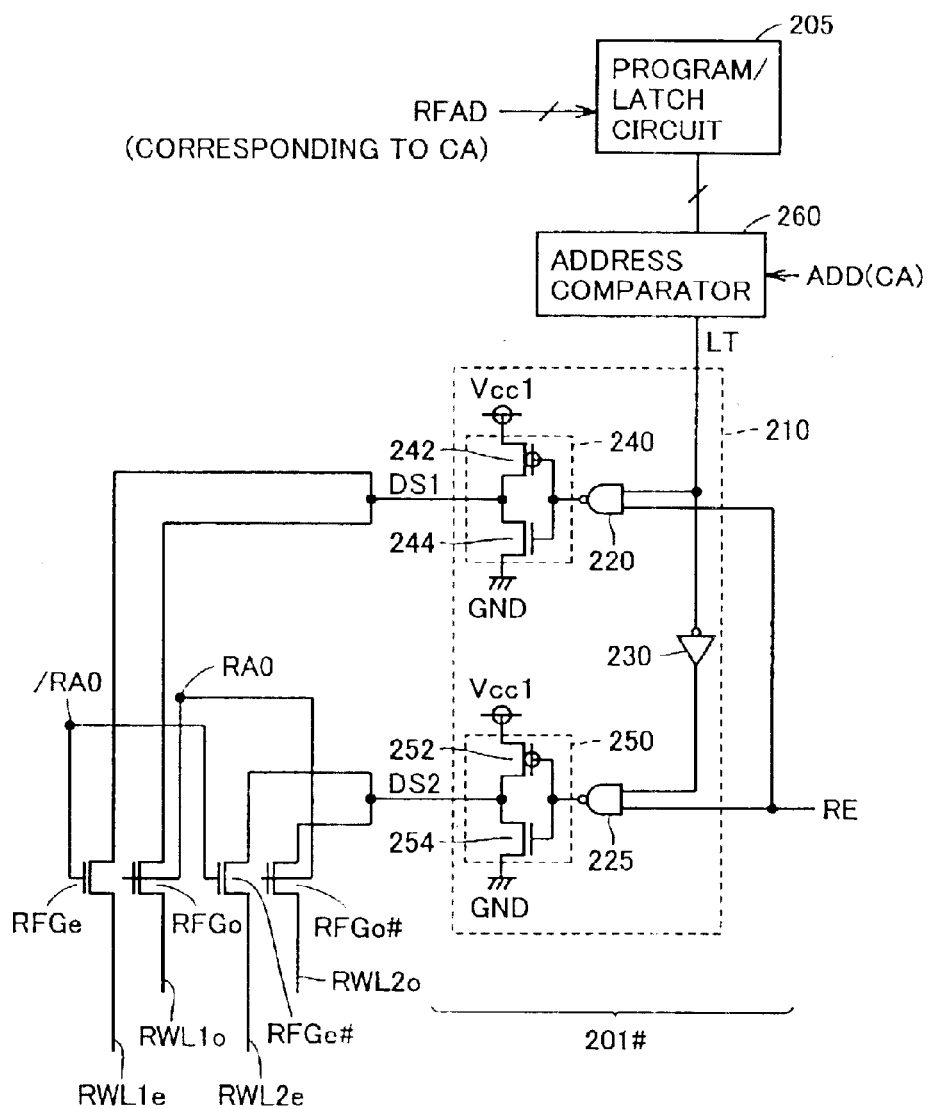
FIG. 15 is a block diagram showing a second example of the structure of the reference cell selecting section according to the third embodiment.

FIG. 15 is a block diagram showing a second example of the structure of the reference cell selecting section according to the third embodiment.

Referring to FIG. 15, a reference cell selecting section 201# according to the second example includes a program/latch circuit 205, an address comparator 260 and a selection signal generating section 210. Program/latch circuit 205 stores a defective address RFAD indicating a region including a defective reference cell. As shown in FIG. 13, in the third embodiment, reference cells RMC are arranged in reference cell row 61. Therefore, the defective address is determined according to a column address CA.

Address comparator 260 operates based on defective address RFAD and address signal ADD (CA) and selection signal generating section 210 operates based on latch signal LT from address comparator 260 and control signal RE in the same manner as that of reference cell selecting section 210 in FIG. 8. Therefore, detailed description thereof will not be repeated.

Moreover, a reference word line RWL is selectively activated based on selection signals SD1, SD2 and address bits RA0, /RA0 in the same manner as that of reference cell selecting section 200# of FIG. 14. Therefore, detailed description thereof will not be repeated.

Accordingly, the same effects as those obtained by the reference cell selecting sections 200, 201 of the first embodiment can be obtained even when the reference cells are arranged in a reference cell row in the memory array. More specifically, even after the MRAM device is shipped, selection of a reference cell RMC and a spare reference cell SRMC can be switched based on the result of the operation test of the reference cells conducted after the MRAM device is used. As a result, like the first embodiment, selection of a reference cell RMC and a spare reference cell SRMC is not fixed based on the result of the operation test of the reference cells conducted before the MRAM device is used, but can be appropriately switched according to input conditions of an address signal or the like based on the result of the operation test of the reference cells conducted after the MRAM device is shipped.

Accordingly, even if characteristics of a reference cell are varied in the manufacturing process or degraded with time, such a defective reference cell can be detected and replaced with a spare reference cell. This ensures stable read operation. Moreover, the life of the MRAM device can be extended in terms of degradation of the reference cells with time.

First Modification of Third Embodiment

Figure 16:
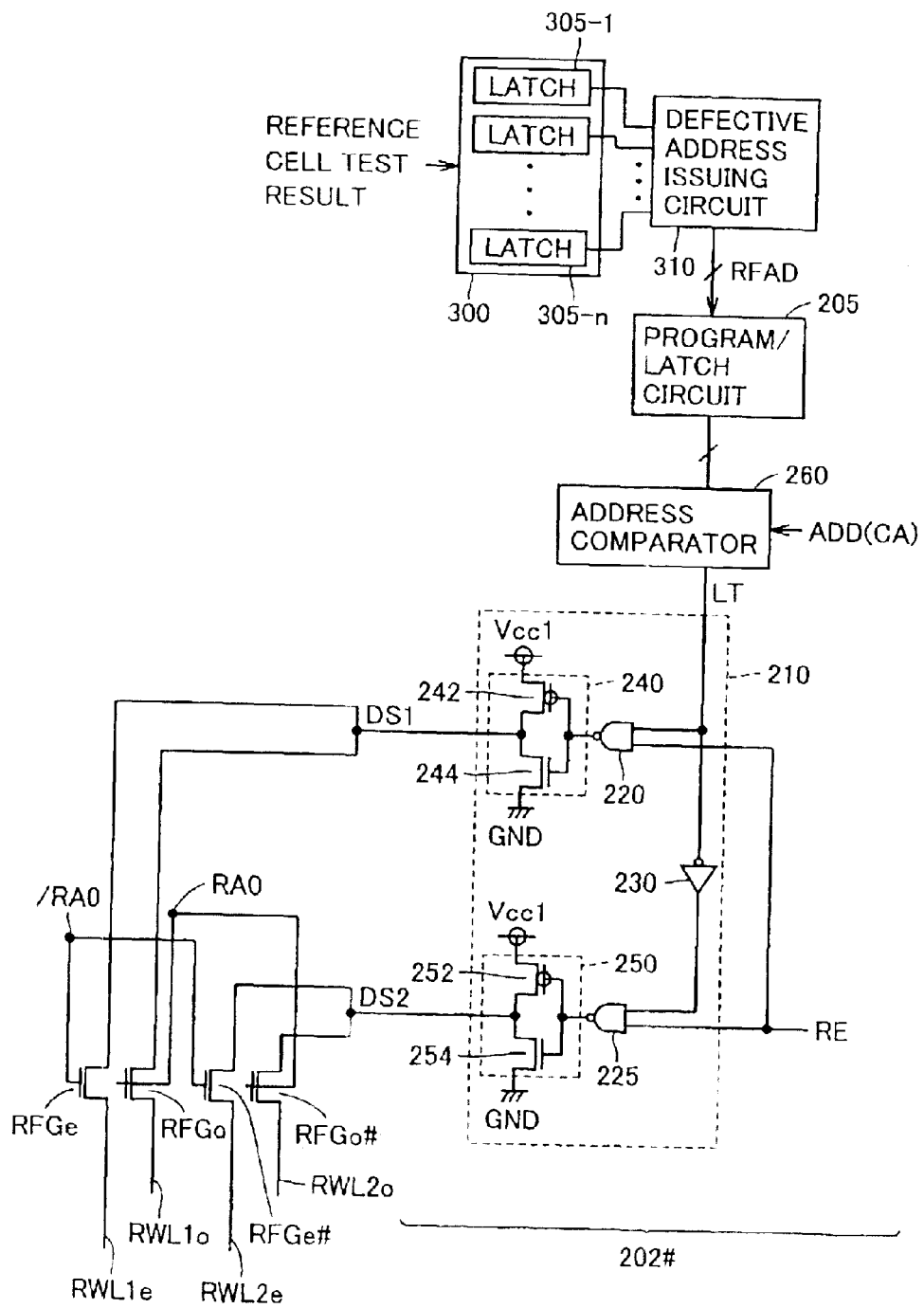
FIG. 16 is a block diagram showing the structure of a reference cell selecting section according to a first modification of the third embodiment.

FIG. 16 is a block diagram showing the structure of a reference cell selecting section 202# according to the first modification of the third embodiment.

Referring to FIG. 16, the difference between reference cell selecting section 202# of the first modification of the third embodiment and reference cell selecting section 201# of FIG. 15 is the same as the difference between reference cell selecting sections 201, 202 in FIGS. 8 and 9. Therefore, detailed description thereof will not be repeated. In the third embodiment, however, reference cells RMC are arranged in a reference cell row. Therefore, each address segment has a prescribed number of memory cell columns. Moreover, the defective address is determined according to a column address CA.

With the above structure, the same effects as those of the first embodiment can be obtained even when the reference cells are arranged in a reference cell row in the memory array. More specifically, since reference cells RMC are accessed more frequently than the normal memory cells, characteristics of reference cells RMC are more likely to be degraded with time. Therefore, operation test of reference cells RMC is conducted every time power is applied to the MRAM device, and a defective reference cell can be replaced with a spare reference cell. Accordingly, read operation accuracy of the MRAM device can be retained even if characteristics of reference cells are degraded with time due to frequent access. This improves operation reliability and extends the life of the MRAM device.

Second Modification of Third Embodiment

Figure 17:
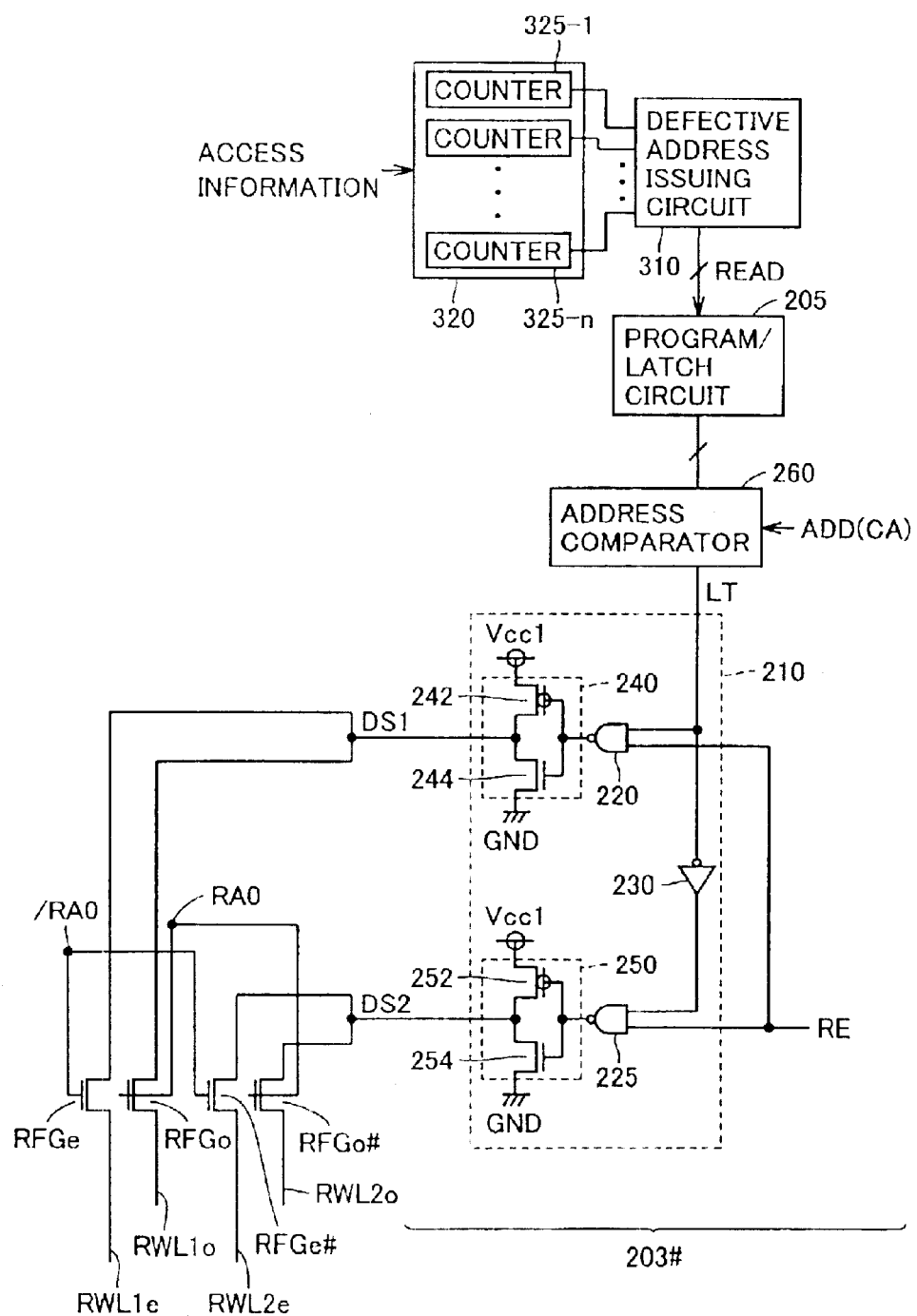
FIG. 17 is a block diagram showing the structure of a reference cell selecting section according to a second modification of the third embodiment.

FIG. 17 is a block diagram showing the structure of a reference cell selecting section 203# according to the second modification of the third embodiment.

Referring to FIG. 17, the difference between reference cell selecting section 203# of the second modification of the third embodiment and reference cell selecting section 202# of FIG. 16 is the same as the difference between reference cell selecting sections 202, 203 in FIGS. 9 and 10. Therefore, detailed description thereof will not be repeated. In the third embodiment, however, reference cells RMC are arranged in a reference cell row. Therefore, each address segment has a prescribed number of memory cell columns. Moreover, the defective address is determined according to a column address CA.

As a result, even when the reference cells are arranged in a reference cell row in the memory array, degradation in characteristics of each reference cell with time caused by frequent access is predicted, and the reference cell is replaced with a spare reference cell before the reference cell actually becomes defective. This enables further improvement in operation reliability.

According to the third embodiment and the modifications thereof, the same effects as those obtained by the first embodiment and the modifications thereof can be obtained even when reference cells RMC are arranged in a reference cell row. More specifically, improved operation reliability and extended life of a non-volatile semiconductor memory device such as an MRAM device can be achieved in terms of degradation in characteristics of the reference cells with time.

In the above embodiments of the present invention, reference cells RMC have the same structure and characteristics as those of normal memory cells MC, and read operation is conducted by applying a desired offset to the sense amplifiers of the first stage. However, the present invention is not limited to such reference cells. The present invention is also applicable to the reference cells which are designed to have different characteristics from those of the normal memory cells.

For example, the present invention is similarly applicable to the structure using reference cells RMC which are designed to have an intermediate level of two electric resistances Rmax, Rmin of normal memory cells MC, preferably, Rref=(Rmax+Rmin)/2.

For example, such a reference cell RMC can be formed by the same tunnel magneto-resistance element TMR as that of a normal memory cell MC and an access transistor having a different transistor size from that of a normal memory cell MC. In normal memory cells MC, tunneling magneto-resistance element TMR may be replaced with a resistive element having a reference resistance Rref.

Regarding the reference cell structure, switching between a reference cell and a spare reference cell, test of reference cells, and the like, the configuration of the present invention is similarly applicable to a memory device which uses a reference cell as reference data in read operation (e.g., a memory device having a memory structure using a phase change material or the like).

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A non-volatile semiconductor memory device, comprising:
    a plurality of memory cells each storing data in a non-volatile manner;
    a reference cell which is compared with a selected memory cell of said plurality of memory cells in read operation;
    a spare reference cell having same characteristics as those of said reference cell, and provided as a spare of said reference cell;
    a reference cell selecting section for selecting one of said reference cell and said spare reference cell in said read operation; and
    a data read circuit for reading storage data of said selected memory cell by comparing access to said one of said reference cell and said spare reference cell which is selected by said reference cell selecting section and access to said selected memory cell, wherein
    said reference cell selecting section switching selection of said reference cell and said spare reference cell according to one of input and operating conditions,
    wherein each of said memory cells includes a resistance storage element having an electric resistance according to the storing data and an access element for forming an access path to said data read circuit in accordance with a selection of said memory cells.

2. The non-volatile semiconductor memory device according to claim 1, wherein said reference cell selecting section selects said one of said reference cell and said spare reference cell based on a result of operation test of said reference cell which is conducted after said non-volatile semiconductor memory device is used.

3. The non-volatile semiconductor memory device according to claim 1, wherein
    said reference cell and said spare reference cell are provided for every prescribed unit group of said plurality of memory cells, and
    said reference cell selecting section selects said one of said reference cell and said spare reference cell according to an address input for selecting said plurality of memory cells.

4. The non-volatile semiconductor memory device according to claim 3, wherein
    said plurality of memory cells, said reference cells and said spare reference cells are divided into a plurality of address segments according to said address input, and
    said reference cell selecting section selects said one of said reference cell and said spare reference cell based on a total number of times one of said plurality of address segments has been accessed so far.

5. The non-volatile semiconductor memory device according to claim 3, wherein
    said plurality of memory cells, said reference cells and said spare reference cells are divided into a plurality of address segments according to said address input, and said reference cell selecting section selects said one of said reference cell and said spare reference cell based on a result of operation test of said reference cell corresponding to that one of said plurality of address segments which is to be accessed.

6. The non-volatile semiconductor memory device according to claim 5, wherein said operation test of said reference cell is automatically conducted upon power-on of said non-volatile semiconductor memory device.

7. The non-volatile semiconductor memory device according to claim 1, wherein said plurality of memory cells are arranged in a matrix, said reference cells share rows with said plurality of memory cells and are arranged in a reference cell column, and said spare reference cells share said rows with said plurality of memory cells and are arranged in a spare reference memory cell column.

8. The non-volatile semiconductor memory device according to claim 1, wherein said plurality of memory cells are arranged in a matrix, said reference cells share columns with said plurality of memory cells and are arranged in a reference cell row, and said spare reference cells share said columns with said plurality of memory cells and are arranged in a spare reference memory cell row.

9. The non-volatile semiconductor memory device according to claim 1, wherein each of said plurality of memory cells includes a magneto-resistance element which is magnetized in a direction corresponding to said storage data and which has an electric resistance varying according to the magnetization direction.

10. A non-volatile semiconductor memory device, comprising:

a plurality of memory cells each storing data in a non-volatile manner;

a plurality of reference cells which are compared with a selected memory cell of said plurality of memory cells in read operation; and a data read circuit for reading storage data of said selected memory cell by comparing access to said selected memory cell and access to at least two of said plurality of reference cells in said read operation, wherein each of said memory cells includes a resistance storage element having an electric resistance according to the storing data and an access element for forming an access path to said data read circuit in accordance with a selection of said memory cells.

11. The non-volatile semiconductor memory device according to claim 10, wherein each of said plurality of reference cells has same characteristics as those of each of said plurality of memory cells, and stores a prescribed one of a plurality of levels of said storage data.

12. The non-volatile semiconductor memory device according to claim 10, wherein said data read circuit includes a plurality of data read units respectively corresponding to said at least two reference cells, each of said plurality of data read units compares an access result to a corresponding one of said at least two reference cells with an access result to said selected memory cell, and said data read circuit reads said storage data based on the comparison results of said plurality of data read units.

13. A non-volatile semiconductor memory device, comprising:

a plurality of memory cells each storing data in a non-volatile manner;

a reference cell which is compared with a selected memory cell of said plurality of memory cells in read operation;

a data read circuit for reading storage data of said selected memory cell by comparing access to said reference cell and access to said selected memory cell in said read operation in normal operation; and a reference cell test section for testing said reference cell in operation test other than said normal operation, wherein each of said memory cells includes a resistance storage element having an electric resistance according to the storing data and an access element for forming an access path to said data read circuit in accordance with a selection of said memory cells.

14. The non-volatile semiconductor memory device according to claim 13, wherein said reference cell test section includes a plurality of test units respectively corresponding to a plurality of levels of said storage data in each of said plurality of memory cells, each of said plurality of test units is designed to have same characteristics as those of each of said plurality of memory cells storing a corresponding one of said plurality of levels, and in said operation test, said data read circuit reads data corresponding said characteristics of one test unit of said plurality of test units based on access to said one test unit and access to said reference cell.

15. The non-volatile semiconductor memory device according to claim 14, wherein, in each of said plurality of test units, said characteristics are adjustable by an external electric input.

* * * * *